US010854257B2

(12) United States Patent
Wang et al.

(10) Patent No.: US 10,854,257 B2
(45) Date of Patent: *Dec. 1, 2020

(54) ELECTRIC FIELD SWITCHABLE MAGNETIC DEVICES

(71) Applicants: Regents of the University of Minnesota, Minneapolis, MN (US); Carnegie Mellon University, Pittsburgh, PA (US)

(72) Inventors: Jian-Ping Wang, Shoreview, MN (US); Delin Zhang, Saint Paul, MN (US); Sara A. Majetich, Pittsburgh, PA (US); Mukund Bapna, Pittsburgh, PA (US)

(73) Assignees: Regents of the University of Minnesota, Minneapolis, MN (US); Carnegie Mellon University, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/782,845

(22) Filed: Feb. 5, 2020

(65) Prior Publication Data
US 2020/0176042 A1    Jun. 4, 2020

Related U.S. Application Data

(63) Continuation of application No. 16/032,716, filed on Jul. 11, 2018, now Pat. No. 10,586,579.
(Continued)

(51) Int. Cl.
*H01L 43/00* (2006.01)
*G11C 11/16* (2006.01)
(Continued)

(52) U.S. Cl.
CPC ........ *G11C 11/161* (2013.01); *G11C 11/1675* (2013.01); *H01L 43/02* (2013.01);
(Continued)

(58) Field of Classification Search
CPC ........................... H01L 27/222; G11C 11/161
See application file for complete search history.

(56) References Cited

U.S. PATENT DOCUMENTS 6,829,157 B2 *  12/2004  Kim ..................... G11C 11/16
                                                  365/157
10,056,430 B1 *  8/2018  Mihajlovic ............. H01L 27/24
(Continued)

OTHER PUBLICATIONS

Alzate et al., "Voltage-Induced Switching of Nanoscale Magnetic Tunnel Junctions," 2012. International Electron Devices Meeting, Dec. 10-13, 2012, 4 pp.
(Continued)

*Primary Examiner* — Nicholas J Tobergte
(74) *Attorney, Agent, or Firm* — Shumaker & Sieffert, P.A.

(57) ABSTRACT

A magnetic device may include a layer stack. The layer stack may include a first ferromagnetic layer; a non-magnetic spacer layer on the first ferromagnetic layer, where the non-magnetic spacer layer comprises at least one of Ru, Ir, Ta, Cr, W, Mo, Re, Hf, Zr, or V; a second ferromagnetic layer on the non-magnetic spacer layer; and an oxide layer on the second ferromagnetic layer. The magnetic device also may include a voltage source configured to apply a bias voltage across the layer stack to cause switching of a magnetic orientation of the second ferromagnetic layer without application of an external magnetic field or a current. A thickness and composition of the non-magnetic spacer layer may be selected to enable a switching direction of the magnetic orientation of the second ferromagnetic layer to be controlled by a sign of the bias voltage.

19 Claims, 15 Drawing Sheets

Related U.S. Application Data

(60) Provisional application No. 62/645,589, filed on Mar. 20, 2018.

(51) Int. Cl.
    H01L 43/08    (2006.01)
    H01L 43/02    (2006.01)
    H01L 43/10    (2006.01)
    B82Y 25/00    (2011.01)
    H01L 27/22    (2006.01)

(52) U.S. Cl.
    CPC .............. *H01L 43/08* (2013.01); *H01L 43/10* (2013.01); *B82Y 25/00* (2013.01); *H01L 27/222* (2013.01)

(56) References Cited

U.S. PATENT DOCUMENTS

| 10,586,579 | B2* | 3/2020 | Wang | H01L 43/02 |
|---|---|---|---|---|
| 2002/0047769 | A1* | 4/2002 | Fedeli | B82Y 25/00 336/174 |
| 2016/0172579 | A1* | 6/2016 | Dieny | G01R 33/093 257/421 |
| 2016/0315252 | A1* | 10/2016 | Pietambaram | H01L 43/08 |

OTHER PUBLICATIONS

You et al., "Prediction of switching/rotation of the magnetization direction with applied voltage in a controllable interlayer exchange coupled system," Journal of Magnetism and Magnetic Materials, Nov. 1998, 13 pp.
Bae et al., "Construction of a Bit Stream Using Telegraphic Switching of a Two-Input Magnetic Tunnel Junction," IEEE Transactions on Magnetics, vol. 53, No. 11, Nov. 2017, 4 pp.
Bergman et al., "Ultrafast switching in a synthetic antiferromagnetic magnetic random-access memory device," Physical Review, Jun. 30, 2011, 6 pp.
Bonell et al., "Large change in perpendicular magnetic anisotropy induced by an electric field in FePd ultrathin films," American Institute of Physics, Jun. 9, 2011, 3 pp.
Brataas et al., "Current-induced torques in magnetic materials," Nature Materials, vol. 11, May 2012, 10 pp.
Bruno "Theory of interlayer magnetic coupling," Physical Review B, vol. 52, No. 1, Jul. 1, 1995, 30 pp.
Chappert et al., "The emergence of spin electronics in data storage," Review Articles, Nature Publishing Group, vol. 6, Nov. 2007, 11 pp.
Chiba et al., "Electrical control of the ferromagnetic phase transition in cobalt at room temperature," Nature Materials, Oct. 2, 2011, 853-856 pp.
Chu et al., "Electric-field control of local ferromagnetism using a magnetoelectric multiferroic," Nature Publishing Group, Apr. 27, 2008, 6 pp.
You et al., "Bias-Voltage-Controlled Interlayer Exchange Coupling," IEEE Transactions on Magnetic, vol. 35, No. 5, Sep. 1999, 4 pp.
Duan et al., "Surface Magnetoelectric Effect in Ferromagnetic Metal Films," Physical Review Letters, vol. 101, Issue 13, Sep. 2008, 4 pp.
Endo et al., "Electric-field effects on thickness dependent magnetic anisotropy of sputtered MgO/Co10Fe40B20/Ta structures," Applied Physics Letters, May 27, 2010, 4 pp.
Fechner et al., "Switching Magnetization by 180 with an Electric Field," Physical Review Letters, American Physical Society, May 11, 2012, 5 pp.
Gamble et al., "Electric Field Induced Magnetic Anisotropy in a Ferromagnet," Physical Review Letters, May 27, 2009, 4 pp.
Grollier et al., "Spintronic Nanodevices for Bioinspired Computing," Proceedings of the IEEE, vol. 104, Issue 10, Oct. 2016, 16 pp.
Hayakawa et al., "Current-Induced Magnetization Switching in MgO Barrier Based Magnetic Tunnel Junctions with CoFeB/Ru/CoFeB Synthetic Ferrimagnetic Free Layer," IEEE Transactions o Magnetics, vol. 44, Issue 7, Jun. 17, 2008, 20 pp.
He et al., "Robust isothermal electric control of exchange bias at room temperature," accessed from http://digitalcommons.unl.edu/cgi/viewcontent.cgi?article=1015&context=physicsbelashchenko, published Jun. 20, 2010, 19 pp.
Zhang et al., "L10-FePd Synthetic Antiferromagnet Through a Face-centered-cubic Ruthenium Spacer Utlized for Perpendicular Magnetic Tunnel Junctions," Physical Review, May 2018, 24 pp.
Heron et al., "Deterministic switching of ferromagnetism at room temperature using an electric field," Nature, vol. 516, Macmillian Publishers Limited, Dec. 2014, 15 pp.
Houssameddine et al., "Spin-torque oscillator using a perpendicular polarizer and a planar free layer," Nature Publishing Group, Apr. 29, 2007, 7 pp.
Ibrahim et al., "Anatomy of electric field control of perpendicular magnetic anisotropy at Fe/MgO interfaces," Physical Review B, Jan. 19, 2016, 6 pp.
Ikeda et al., "A perpendicular-anisotropy CoFeB-MgO magnetic tunnel junction," Nature Materials, vol. 9, published online Jul. 11, 2010, 5 pp.
Jiang et al., "Substantial reduction of critical current for magnetization switching in an exchange-biased spin valve," Nature Publishing Group, May 9, 2004, 5 pp.
Kanai et al., "Electric field-induced magnetization reversal in a perpendicular-anisotropy CoFeB-MgO magnetic tunnel junction," American Institute of Physics, Sep. 18, 2012, 3 pp.
Kent et al., "A new spin on magnetic memories," Focus Commentary, Nature Nanotechnology, vol. 10, Mar. 2015, 5 pp.
Kubota et al., "Quantitative measurement of voltage dependence of spin-transfer torque in MgO-based magnetic tunnel junctions, 1" Nature Publishing Group, Nov. 25, 2007, 5 pp.
Lau et al., "Spin-orbit torque switching without external field with a ferromagnetic exchange-biased coupling layer," submitted on Nov. 18, 2015.
Li et al., "Enhancement of voltage-controlled magnetic anisotropy through precise control of Mg insertion thickness at CoFeBjMgO interface," AIP Publishing, Jan. 30, 2017, 5 pp.
Liu et al., "Spin torque switching with the giant spin Hall effect of tantalum," Science, May 4, 2012, 31 pp.
Liyanagedera et al., "Stochastic Spiking Neural Networks Enabled by Magnetic Tunnel Junctions: From Nontelegraphic to Telegraphic Switching Regimes," Phys. Rev. Applied 8, Jan. 29, 2018, 12 pp.
Lv et al., "A Single Magnetic-Tunnel-Junction Stochastic Computing Unit," IEEE, Jan. 23, 2018, 4 pp.
Maruyama et al., "Large voltage-induced magnetic anisotropy change in a few atomic layers of iron," Nature Nanotechnology, Jan. 18, 2009, 3 pp.
Matsukura et al., "Control of magnetism by electric fields," Nature Nanotechnology, Mar. 5, 2015, 12 pp.
Mellnik et al., "Spin-transfer torque generated by a topological insulator," Letter, Macmillan Publishers Limited, vol. 511, Jul. 24, 2014, 11 pp.
Miron et al., "Perpendicular switching of a single ferromagnetic layer induced by in-plane current injection," Macmillian Publishers Limited, vol. 476, Nature 189, Aug. 11, 2011, 6 pp.
Nakamura et al., "Giant Modification of the Magnetocrystalline Anisotropy in Transition-Metal Monolayers by an External Electric Field," Physical Review Letters, The American Physical Society, May 5, 2009, 4 pp.
Nakamura et al., "Origin of electric field-induced magnetocrystalline anisotropy modification at Fe(001) surfaces: Mechanism of dipole formation from first principles," Jul. 1, 2010, 6 pp.
Niranjan et al., "Electric field effect on magnetization at the Fe/MgO(001) interface," American Institute of Physics, Jun. 2, 2010, 3 pp.
Nozaki et al., "Electric-field-induced ferromagnetic resonance excitation in an ultrathin ferromagnetic metal layer" Nature Physics, Apr. 29, 2012, 6 pp.

(56) References Cited

OTHER PUBLICATIONS

Nozaki et al., "Large Voltage-Induced Changes in the Perpendicular Magnetic Anisotropy of an MgO-Based Tunnel Junction with an Ultrathin Fe Layer," American Physical Society, Apr. 15, 2016, 10 pp.

Nozaki et al., "Voltage-induced perpendicular magnetic anisotropy change in magnetic tunnel junctions," Applied Physics Letters, Jan. 11, 2010, 4 pp.

Yoshida et al., "Enhanced Thermal Stability in Perpendicular Top-Pinned Magnetic Tunnel Junction With Synthetic Antiferromagnetic Free Layers," IEEE Transactions on Magnetics, vol. 49, No. 7, Jul. 2013, 4 pp.

Ong et al., "Giant voltage modulation of magnetic anisotropy in strained heavy metal/magnet/insulator heterostructures," Physical Review B, Jul. 2015, 6 pp.

Parkin, "Systematic Variation of the Strength and Oscillation Period of Indirect Magnetic Exchange Coupling through the 3d, 4d, and 5d Transition Metals," Physical Review Letters, vol. 67, No. 25, Dec. 16, 1991, 4 pp.

Piotrowski et al., "Size and voltage dependence of effective anisotropy in sub-100-nm perpendicular magnetic tunnel junctions," American Physical Society, Jul. 5, 2016, 10 pp.

Prenat et al., "Ultra-Fast and High-Reliability SOT-MRAM: From Cache Replacement to Normally-Off Computing," IEEE Transactions on Multi-Scale Computing Systems, vol. 2, No. 1, Jan.-Mar. 2016, 12 pp.

Rajanikanth et al., "Magnetic anisotropy modified by electric field in V/Fe/MgO(001)/Fe epitaxial magnetic tunnel junction," Applied Physics Letters, Aug. 5, 2013, 4 pp.

Ruiz-Diaz et al., "Tuning Magnetic Anisotropy in Metallic Multilayers by Surface Charging: An Ab Initio Study" Physical Review Letters, Jun. 25, 2015, 5 pp.

Seki et al., "Coercivity change in an FePt thin layer in a Hall device by voltage application," American Institute of Physics, May 24, 2011, 3 pp.

Shiota et al., "Induction of coherent magnetization switching in a few atomic layers of FeCo using voltage pulses," Nature Materials, Nov. 13, 2011, 5 pp.

Shiota et al., "Opposite signs of voltage-induced perpendicular magnetic anisotropy change in CoFeBjMgO junctions with different underlayers," Aug. 23, 2013, AIP Publishing LLC, 4 pp.

Shiota et al., "Voltage-assisted magnetization switching in ultrathin Fe80Co20 alloy layers," Applied Physics Express, May 2009, 14 pp.

Skowroski et al., "Perpendicular magnetic anisotropy of Ir/CoFeB/MgO trilayer system tuned by electric fields," The Japan of Applied Physics, Apr. 24, 2015, 5 pp.

Sonntag et al., "Electric-Field-Induced Magnetic Anisotropy in a Nanomagnet Investigated on the Atomic Scale," Physical Review Letters, Jan. 8, 2014, 7 pp.

Suh et al., "Neural coding using telegraphic switching of magnetic tunnel junction," Journal of Applied Physics, Mar. 10, 2015, 4 pp.

Torrejon et al., "Neuromorphic computing with nanoscale spintronic oscillators," Nature, vol. 547, Jul. 27, 2017, 5 pp.

Tsujikawa et al., "Finite electric field effects in the large perpendicular magnetic anisotropy surface Pt/Fe/Pt(001)," Physical Review Letters, vol. 102, Issue 24, Jun. 19, 2009, 10 pp.

Wadley et al., "Electrical switching of an antiferromagnet," Science, Feb. 2016, 24 pp.

Wang et al., "Electric-Field Control of Spin-Orbit Interaction for Low-Power Spintronics," Proceedings of the IEEE, vol. 104, No. 10, Oct. 2016, 35 pp.

Wang et al., "Electric-field-assisted switching in magnetic tunnel junctions," Nature Materials, Nov. 13, 2011, 5 pp.

Wang et al., "First-principles theory of surface magnetocrystalline anisotropy and the diatomic-pair model," Physical Review B, vol. 47, No. 22, Jun. 1, 1993, 16 pp.

Wang et al., "Low-power non-volatile spintronic memory: STT-RAM and beyond," Journal of Physics D: Applied Physics, Jan. 31, 2013, 11 pp.

Weisheit et al., "Electric Field—Induced Modification of Magnetism in Thin-Film Ferromagnets," Science, vol. 315, Feb. 23, 2007, 5 pp.

Wen et al., "Voltage control of magnetic anisotropy in epitaxial Ru/Co2FeAl/MgO heterostructures," Scientific Reports, Mar. 23, 2017, 8 pp.

Wolf et al., "Spintronics: A Spin-Based Electronics Vision for the Future," Magnetism and Materials, Science, vol. 294, Nov. 16, 2001, 9 pp.

Yakata et al., "Thermal stability and spin-transfer switchings in MgO-based magnetic tunnel junctions with ferromagnetically and antiferromagnetically coupled synthetic free layers," American Institute of Physics, Dec. 16, 2009, 3 pp.

Yakushiji et al., "Ultralow-Voltage Spin-Transfer Switching in Perpendicularly Magnetized Magnetic Tunnel Junctions with Synthetic Antiferromagnetic Reference Layer" Applied Physics Express, Nov. 1, 2013, 4 pp.

Yakushiji et al., "Very strong antiferromagnetic interlayer exchange coupling with iridium spacer layer for perpendicular magnetic tunnel junctions," AIP Publishing, Feb. 28, 2017, 4 pp.

Yang et al., "First-principles investigation of the very large perpendicular magnetic anisotropy at Fe | MgO and Co | MgO interfaces," American Physical Society, Aug. 1, 2011, 6 pp.

Annunziata et al., "Materials investigation for thermally-assisted magnetic random access memory robust against 400 C temperatures," Journal of Applied Physics, vol. 117, Apr. 22, 2015, 5 pp.

Morro et al., "A Stochastic Spiking Neural Network for Virtual Screening" IEEE Transactions on Neural Networks and Learning Systems, vol. 29, No. 4, Apr. 2018, 6 pp.

Spaldin et al., "Electric-Field Switchable Magnets: The Case of BaNiF4", The American Physical Society, Physical Review B 74, Jul. 5, 2006, pp. 020401-1 to 020401-4.

Tsymbal et al., "Electric toggling of magnets," Nature Materials, vol. 11, Jan. 2012, pp. 12-13.

Venkatesan et al., "Spintastic: Spin-based Stochastic Logic for Energy-efficient Computing," Proceedings of the 2015 Design, Automation & Test in Europe Conference & Exhibition (Date), Mar. 2015, pp. 1575-1578.

Chun-Yeol et al., "Bias-Voltage-Controlled Interlayer Exchange Coupling," IEEE Transactions on magnetics, vol. 35, No. 5, Sep. 1999, 4 pp.

Cherifi et al. "Electric-field control of magnetic order above room temperature," Nature Materials, vol. 13, Apr. 2014, 8 pp.

Prosecution History from U.S. Appl. No. 16/032,716, dated Jun. 7, 2019 through Oct. 28, 2019, 28 pp.

* cited by examiner

FIG. 11A
FIG. 11B
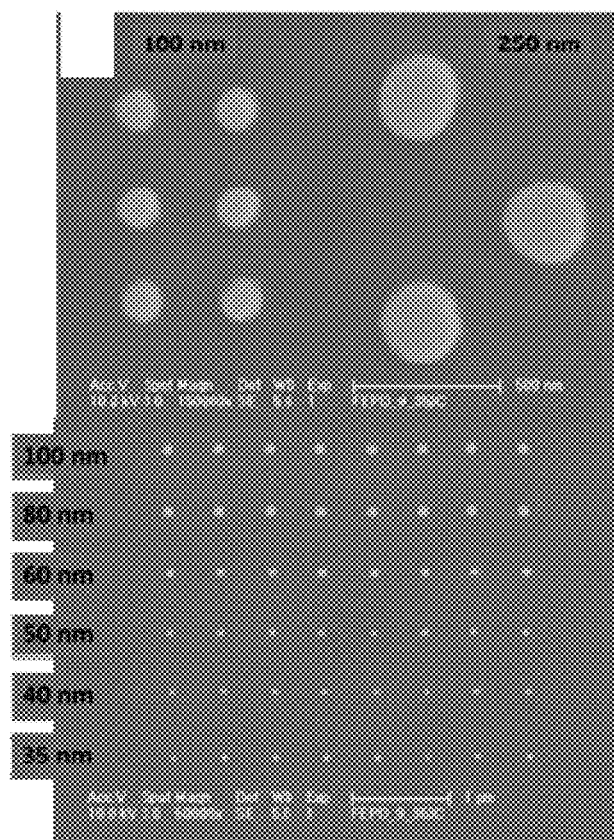
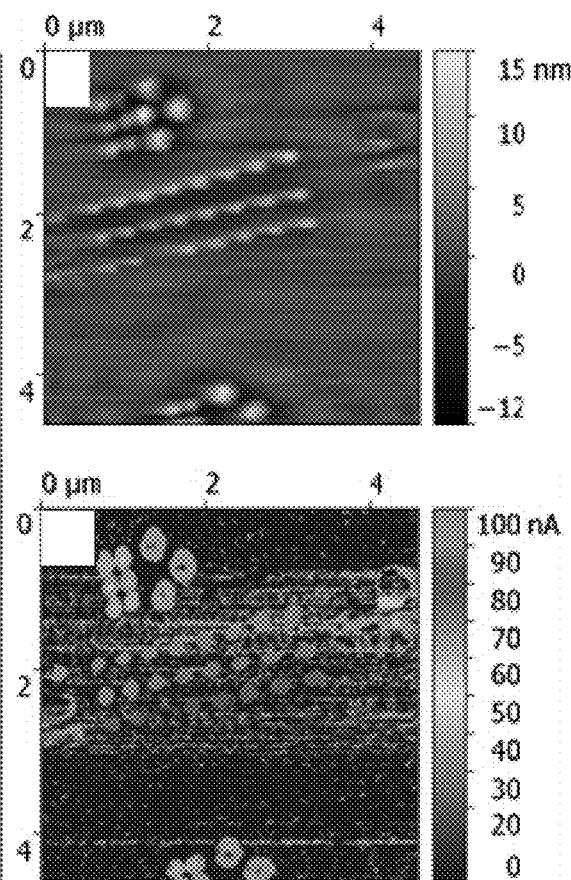
FIG. 11C

FIG. 12A
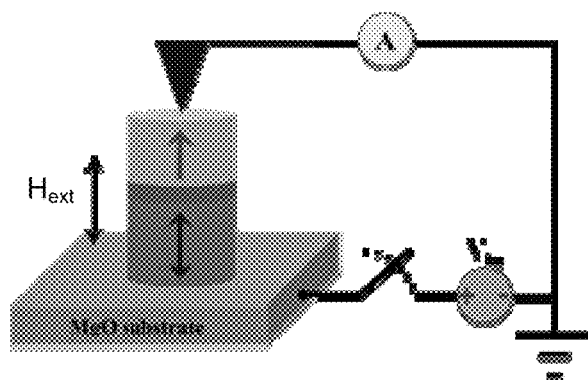
FIG. 12B
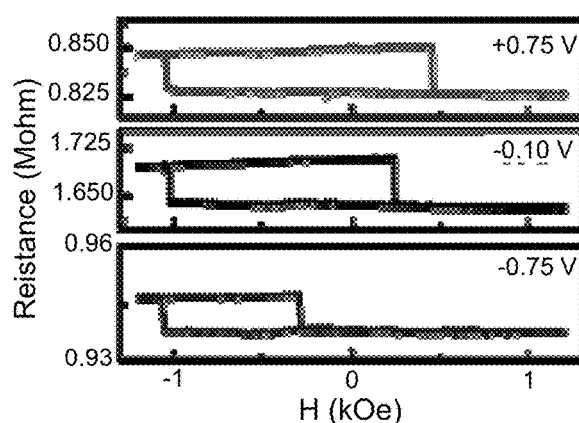
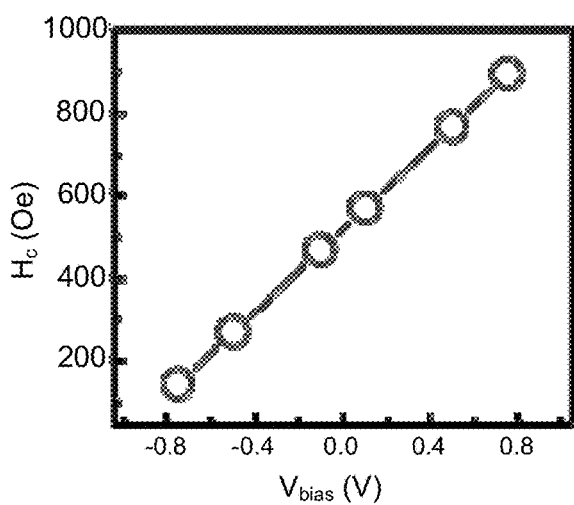
FIG. 12C
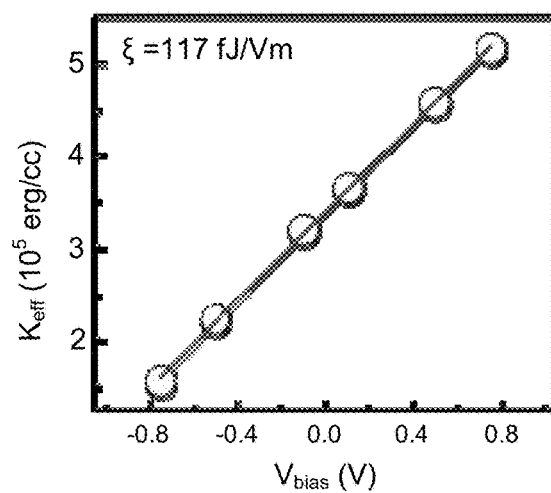
FIG. 12D

FIG. 14A
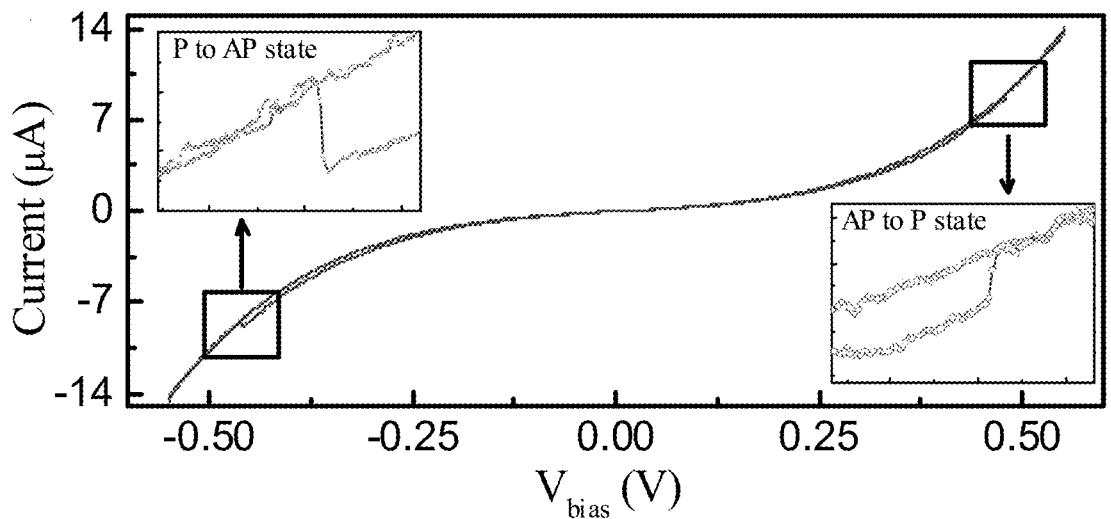
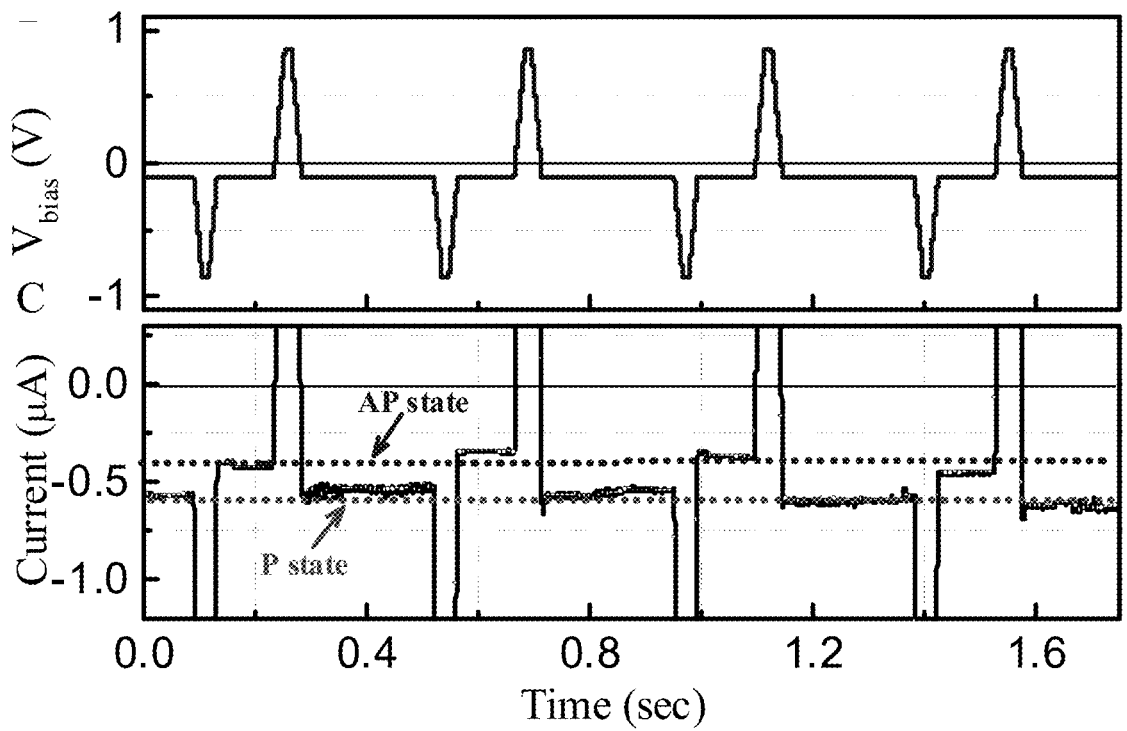
FIG. 14B

ELECTRIC FIELD SWITCHABLE MAGNETIC DEVICES

This application is a continuation of U.S. patent application Ser. No. 16/032,716, titled "ELECTRIC FIELD SWITCHABLE MAGNETIC DEVICES", filed on Jul. 11, 2018, which claims the benefit of U.S. Provisional Patent Application No. 62/645,589, titled, "ELECTRIC FIELD SWITCHABLE MAGNETIC DEVICES," filed Mar. 20, 2018, the entire contents of which are incorporated herein by reference.

GOVERNMENT RIGHTS

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to magnetic devices including magnetic structures, and more particularly, magnetic tunnel junctions.

BACKGROUND

The scaling of conventional semiconductor devices may be limited by factors including device reliability and increased power consumption. Improvement in the performance of memory and computational devices is continuously pursued. Magnetic tunnel junction structures use relative orientation of two or more magnetic layers to affect resistance of the magnetic tunnel junction structure and may be used in logic and memory devices.

SUMMARY

In some examples, the disclosure describes a magnetic device that includes a layer stack. The layer stack may include a first ferromagnetic layer; a non-magnetic spacer layer on the first ferromagnetic layer, where the non-magnetic spacer layer comprises at least one of Ru, Ir, Ta, Cr, W, Mo, Re, Hf, Zr, or V; a second ferromagnetic layer on the non-magnetic spacer layer; and an oxide layer on the second ferromagnetic layer. The magnetic device also may include a voltage source configured to apply a bias voltage across the layer stack to cause switching of a magnetic orientation of the second ferromagnetic layer without application of an external magnetic field or a current. A thickness and composition of the non-magnetic spacer layer may be selected to enable a switching direction of the magnetic orientation of the second ferromagnetic layer to be controlled by a sign of the bias voltage.

In some examples, the disclosure describes a method that includes controlling, by a write controller, a voltage source to output a positive bias voltage across a layer stack. The layer stack includes a first ferromagnetic layer; a non-magnetic spacer layer on the first ferromagnetic layer, where the non-magnetic spacer layer comprises at least one of Ru, Ir, Ta, Cr, W, Mo, Re, Hf, Zr or V; a second ferromagnetic layer on the non-magnetic spacer layer; and an oxide layer on the second ferromagnetic layer. The positive bias voltage causes switching of a magnetic orientation of the second ferromagnetic layer from a first direction to a second direction without application of an external magnetic field or a current. The method also includes controlling, by the write controller, the voltage source to output a negative bias voltage across the layer stack. The negative bias voltage causes switching of the magnetic orientation of the second ferromagnetic layer from the second direction to the first direction without application of an external magnetic field or a current.

In some examples, the disclosure describes a voltage controlled magnetic anisotropy magnetoresistive random access memory device including a layer stack and a voltage source. The layer stack may include a first ferromagnetic layer; a non-magnetic spacer layer on the first ferromagnetic layer, where the non-magnetic spacer layer comprises at least one of Ru, Ir, Ta, Cr, W, Mo, Re, Hf, Zr, or V; a second ferromagnetic layer on the non-magnetic spacer layer; and an oxide layer on the second ferromagnetic layer. The voltage source may be configured to apply a bias voltage across the layer stack to cause switching of a magnetic orientation of the second ferromagnetic layer without application of an external magnetic field or a current. A thickness and composition of the non-magnetic spacer layer may be selected to enable a switching direction of the magnetic orientation of the second ferromagnetic layer to be controlled by a sign of the bias voltage.

In some examples, the disclosure describes a stochastic computing device including a random bit stream generator. The random bit stream generator includes a layer stack and a voltage source. The layer stack may include a first ferromagnetic layer; a non-magnetic spacer layer on the first ferromagnetic layer, where the non-magnetic spacer layer comprises at least one of Ru, Ir, Ta, Cr, W, Mo, Re, Hf, Zr, or V; a second ferromagnetic layer on the non-magnetic spacer layer; and an oxide layer on the second ferromagnetic layer. The voltage source may be configured to apply a bias voltage across the layer stack to cause switching of a magnetic orientation of the second ferromagnetic layer without application of an external magnetic field or a current. A thickness and composition of the non-magnetic spacer layer may be selected to enable a switching direction of the magnetic orientation of the second ferromagnetic layer to be controlled by a sign of the bias voltage.

In some examples, the disclosure describes a stochastic spiking neural network device including a magnetic device. The magnetic device includes a layer stack and a voltage source. The layer stack may include a first ferromagnetic layer; a non-magnetic spacer layer on the first ferromagnetic layer, where the non-magnetic spacer layer comprises at least one of Ru, Ir, Ta, Cr, W, Mo, Re, Hf, Zr, or V; a second ferromagnetic layer on the non-magnetic spacer layer; and an oxide layer on the second ferromagnetic layer. The voltage source may be configured to apply a bias voltage across the layer stack to cause switching of a magnetic orientation of the second ferromagnetic layer without application of an external magnetic field or a current. A thickness and composition of the non-magnetic spacer layer may be selected to enable a switching direction of the magnetic orientation of the second ferromagnetic layer to be controlled by a sign of the bias voltage. In some examples, the magnetic device may be used as part or all of the neurons of the stochastic spiking neural network device.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIGS. 11A-11C illustrate a scanning electron microscopy image of a top view of the 350° C.-annealed FePd synthetic antiferromagnet perpendicular magnetic tunnel junction stacks with diameters ranging from about 35 nm to about 250 nm, an atomic force microscopy image illustrating topography of the pillars, and a current map measured by conductive atomic force microscopy at 100 mV, respectively.

FIG. 12A is a conceptual and schematic diagram illustrating an experimental setup for performing measurements on a perpendicular magnetic tunnel junction using conductive atomic force microscopy, in which the atomic force microscopy tip is grounded and the bias voltage is applied at the bottom electrode.

FIG. 12B is a plot of minor magnetoresistance versus applied perpendicular external magnetic field ($H_{ext}$) for an 100-nm diameter FePd synthetic antiferromagnet perpendicular magnetic tunnel junction at different bias voltages ($V_{bias}$=+0.75 V, −0.1 V and −0.75 V, respectively).

FIG. 12C is a plot depicting the mean coercivity ($H_c$) of a dual SAF free layer of a 100-nm diameter FePd synthetic antiferromagnet perpendicular magnetic tunnel junction as a function of bias voltage ($V_{bias}$).

FIG. 12D is a plot of effective magnetic anisotropy ($K_{u,eff}$) versus bias voltage ($V_{bias}$) and a fitted coefficient of voltage controlled magnetic anisotropy (VCMA).

FIG. 14A is a plot of a current versus bias voltage ($V_{bias}$) curve (I-V curve) obtained by sweeping the bias voltage ($V_{bias}$) from −0.6 V to +0.6 V for an 100-nm diameter FePd synthetic antiferromagnet perpendicular magnetic tunnel junction annealed at 350° C.

FIG. 14B illustrates plots of the bi-directional magnetization switching by writing by a voltage and reading by current (bias voltage versus time and current versus time), respectively, for an 100-nm diameter FePd synthetic antiferromagnet perpendicular magnetic tunnel junction.

DETAILED DESCRIPTION

Figure 1:
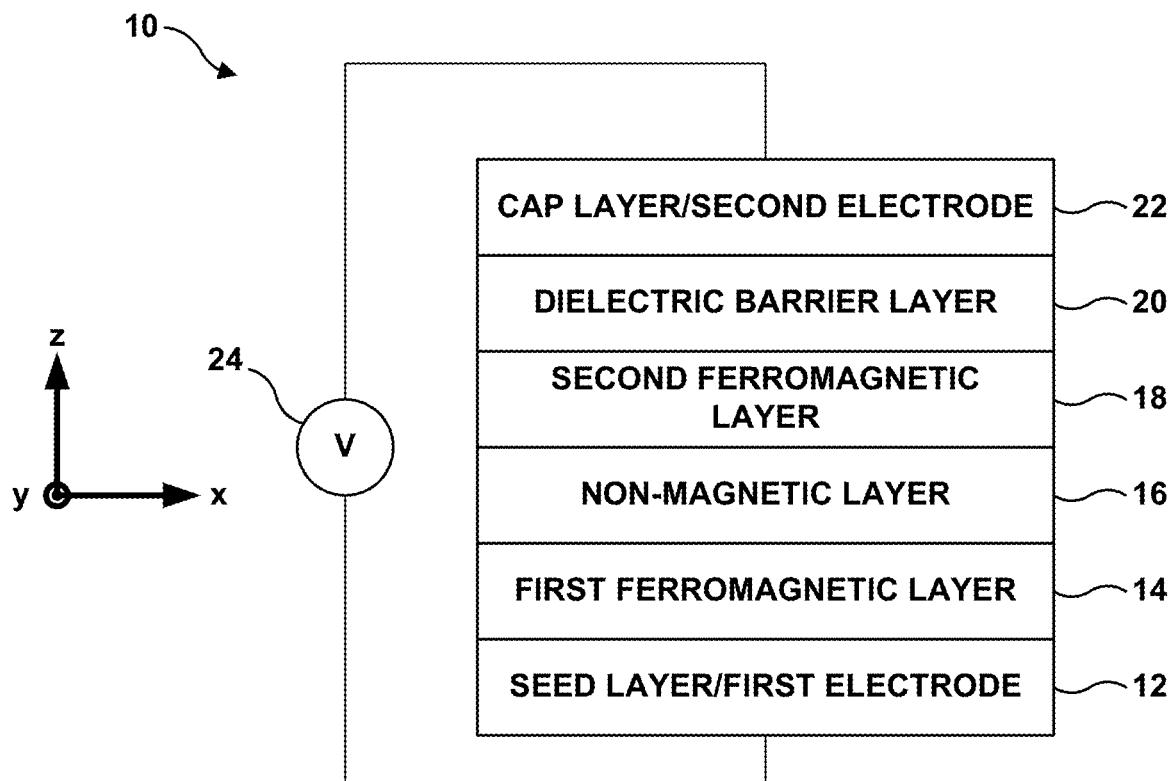
FIG. 1 is a conceptual block diagram of a layer stack that includes a composite free layer with a synthetic antiferromagnetic structure, in accordance with examples of the disclosure.

The disclosure describes perpendicular synthetic antiferromagnetic (p-SAF) structures and perpendicular magnetic tunnel junctions (p-MTJs) using these p-SAF structures. The strength and sign of magnetic coupling of these p-SAF structures may be changed and the p-MTJs with these p-SAF described herein may be switched using only an applied electric field (bias voltage), without using an applied external magnetic field or an applied current. The p-SAF structure, that includes a first ferromagnetic layer/non-magnetic layer (as a spacer)/second ferromagnetic layer/dielectric layer heterostructure, may be designed with interfacial perpendicular magnetic anisotropy (i-PMA) materials. The i-PMA materials include a non-magnetic layer/ferromagnetic layer/dielectric layer heterostructure. The magnetic anisotropy of the ferromagnetic layer may be selected so that magnetic orientation of the ferromagnetic layer may be switched upon application of an electric field (e.g., via a bias voltage) without application of an external magnetic field or spin current. The thickness and composition of the non-magnetic layer of the p-SAF structure may be selected so that a sign and strength of the interlayer exchange coupling (IEC) between the first ferromagnetic layer and second ferromagnetic layer may be affected by application of an electric field (e.g., via a bias voltage) without application of an external magnetic field or current. This may result in switching of a magnetic orientation of the second ferromagnetic layer in response to application of an electric field (e.g., via a bias voltage) with a selected sign, without application of an external magnetic field or current. The p-SAF structure may be used as part of a p-MTJ, for example, as a SAF free layer.

The applied electric field may modify magnetic anisotropy of the ferromagnetic layer of the i-PMA structure, affect interlayer exchange coupling between two ferromagnetic layers, or both. For example, based on the sign of the applied bias voltage, electrons may accumulate or be depleted at the interface between the second ferromagnetic layer and the dielectric layer. This accumulation or depletion of electrons at the interface shifts the fermi level ($E_F$) of ferromagnetic layer, increasing or decreasing the minority spin density (d-orbitals), respectively. Increasing the minority spin density (d-orbitals) may enhance the reflectivity of the minority spins in the non-magnetic layer/second ferromagnetic layer interface and lead to ferromagnetic coupling, while decreasing the minority spin density (d-orbitals) may reduce the reflectivity of the minority spins in the non-magnetic layer/second ferromagnetic layer interface and lead to anti-ferromagnetic coupling. In this way, applying a bias voltage of a selected sign and sufficient magnitude can achieve switching between anti-ferromagnetic coupling and ferromagnetic coupling and vice versa, thus achieving switching of the p-MTJ between high and low resistance states, without application of an external magnetic field or a current.

In some examples, the p-MTJ with p-SAF structure may be used as a memory or logic device, for example, for a magnetoresistive random access memory or an all-spin logic device. By controlling the bias voltage applied across the p-MTJ with p-SAF free layer, the sign of p-SAF can be tuned and form ferromagnetic coupling or antiferromagnetic coupling, realizing the high or low resistance states for p-MTJs. This may provide the efficient way to obtain the memory or logic devices with high switching speed and ultralow energy consumption.

In some examples, the p-MTJ with p-SAF free layer may be used as a random bit generator, for example, for a stochastic computing device or a stochastic spiking neural network. By controlling the bias voltage applied across the p-MTJ with p-SAF free layer, the thermal stability of the free layer of the MTJ may be controlled so that thermal energy at room temperature is sufficient to cause switching the ferromagnetic coupled and anti-ferromagnetic coupled states, or the sign of p-SAF free layer can be oscillated so that bias voltage (E-field) at room temperature is sufficient to cause switching the ferromagnetic coupled and anti-ferromagnetic coupled states. This may be used to produce random bits, e.g., as part of a random bit stream for a stochastic computing device or a stochastic spiking neural network.

FIG. 1 is a conceptual block diagram of a layer stack 10 that includes a composite free layer with a SAF structure, in accordance with examples of the disclosure. Layer stack 10 includes a seed layer/first electrode 12, a first ferromagnetic layer 14 on seed layer/first electrode 12, a non-magnetic layer 16 on first ferromagnetic layer 14, a second ferromagnetic layer 18 on non-magnetic layer 16, a dielectric barrier layer 20 on second ferromagnetic layer 18, and a cap layer/second electrode 22 on dielectric barrier layer 20.

Seed layer/first electrode 12 may include a material selected to help establish a preferred growth configuration for first ferromagnetic layer 14. Seed layer/first electrode 12 also may be electrically conductive to function as an electrode for application of a bias voltage (E-field) to layer stack 10. In some examples, seed layer/first electrode 12 may include Cr, Pt, Pd, a Cr/Pt, Cr/Pd, Cr/Ru bilayer, or the like.

For example, seed layer/first electrode 12 may include a first layer of Cr on a substrate and a second layer of Pt on the first layer of Cr. In some examples, the first layer of Cr may be thicker than the second layer of Pt. For example, the first layer of Cr may define a thickness of between about 10 nm and about 50 nm, such as 15 nm, and the second layer of Pt may define a thickness of between about 2 nm and about 50 nm, such as about 5 nm.

First ferromagnetic layer 14 may include a ferromagnetic material. First ferromagnetic layer 14 may have an easy magnetic axis oriented out of the plane of first ferromagnetic layer 14, e.g., substantially perpendicular to the plane of first ferromagnetic layer 14. First ferromagnetic layer 14 may include a ferromagnetic thin film having perpendicular magnetic anisotropy, such as FePd, FePt, CoPd, CoPt, a Mn-based Heusler alloy, MnAl, MnBi, MnGaN, MnGeN, or the like. First ferromagnetic layer 14 may define any suitable thickness, such as between about 1 nm and about 12 nm, such as between about 1 nm and about 4 nm, or about 2 nm, or between about 3 nm and about 12 nm.

Non-magnetic layer 16 is on first ferromagnetic layer 14 and includes a non-magnetic material. Non-magnetic layer 16 is a spacer layer between first ferromagnetic layer 14 and second ferromagnetic layer 18. The non-magnetic material may include the materials which can generate the interlayer exchange coupling between first ferromagnetic layer 14 and second ferromagnetic layer 18. The non-magnetic material may include, for example, Ru, Ir, Ta, Cr, W, Mo, V, MgO, Re, Hf, Zr or the like. In some examples, non-magnetic layer 16 may include multiple sub-layers, such as a Ru/Ta bilayer, a Ru/Pt bilayer, an Ir/Ta bilayer, a Ru/Mg, or the like. Non-magnetic layer 16 may define a thickness between about 0.3 nm and about 5 nm, such as Non-magnetic layer 16 generates interlayer exchange coupling (IEC) between first ferromagnetic layer 14 and second ferromagnetic layer 18. The default (e.g., in the absence of a bias voltage) IEC, whether ferromagnetic coupling or antiferromagnetic coupling, may depend at least in part upon the thickness of non-magnetic layer 16. For example, a non-magnetic layer 16 with a thickness between about 0.3 nm and about 3.0 nm may cause the transition of ferromagnetic coupling or anti-ferromagnetic coupling between first ferromagnetic layer 14 and second ferromagnetic layer 18 in the absence of a bias voltage applied to layer stack 10. In some examples, non-magnetic layer 16 may include Ru and a thickness of between 1 nm and about 2 nm, such as about 1.1 nm; Ta and a thickness of between about 0.5 nm and about 2.5 nm, such as about 0.8 nm.

Further, a thickness and a composition of non-magnetic layer 16 may be selected to control the strength of the interlayer exchange coupling between first ferromagnetic layer 14 and second ferromagnetic layer 18. For example, the thickness and the composition of non-magnetic layer 16 may be selected so that application of a bias voltage across layer stack 10 resulting in switching of a magnetic orientation of second ferromagnetic layer 18.

Second ferromagnetic layer 18 is on non-magnetic layer 16 and includes a ferromagnetic material. Second ferromagnetic layer 18 may have an easy magnetic axis oriented in plane or out of the plane of second ferromagnetic layer 18, e.g., substantially perpendicular to the plane of second ferromagnetic layer 18. Second ferromagnetic layer 18 may include, for example, a CoFeB alloy, such as $Co_{20}Fe_{60}B_{20}$; a CoFe alloy, Co, Fe, a Co-based Heusler alloy, or a Mn-based Heusler alloy. Second ferromagnetic layer 18 may define any suitable thickness, such as between about 1 nm and about 12 nm, such as between about 1 nm and about 4 nm, or about 2 nm, or between about 3 nm and about 12 nm. In some examples, second ferromagnetic layer 18 includes a CoFeB alloy and a thickness of about 1.3 nm. in some examples, second ferromagnetic layer 18 may possess interfacial or bulk perpendicular magnetic anisotropy. The magnetic anisotropy of second ferromagnetic layer 18 may controlled based on a thickness and a composition of second ferromagnetic layer 18. The thickness and composition of second ferromagnetic layer 18 may be selected so that magnetic orientation of second ferromagnetic layer 18 (e.g., rather than first ferromagnetic layer 18) may be switched upon application of an electric field (e.g., via a bias voltage) without application of an external magnetic field or a current.

First ferromagnetic layer 14, non-magnetic layer 16, and second ferromagnetic layer 18 may define a synthetic antiferromagnet (SAF). For example, in the absence of a bias voltage, first ferromagnetic layer 14 may be antiferromagnetically coupled to second ferromagnetic layer.

Dielectric barrier layer 20 is on second ferromagnetic layer 18 and may include a suitable dielectric material, such as, for example, an oxide. Suitable oxides include MgO, AlOx, $MgAl_2O_4$, $HfO_x$, or the like. Dielectric barrier layer 20 may define any suitable thickness, such as between about 1 nm and about 30 nm.

Cap layer/second electrode 22 is on dielectric barrier layer 20 and include one or more electrically conductive layers. For example, cap layer/second electrode may include a first layer including Ta and a second layer including Ti, Au, or the like.

Cap layer/second electrode 22 and seed layer/first electrode 12 may be electrically connected to a voltage source 24. In some examples, one or both of cap layer/second electrode 22 or seed layer/first electrode 12 may be electrically connected to voltage source 24 indirectly. For example, voltage source 24 may be electrically connected to a substrate on which seed layer/first electrode 12 is formed.

Figure 2A:
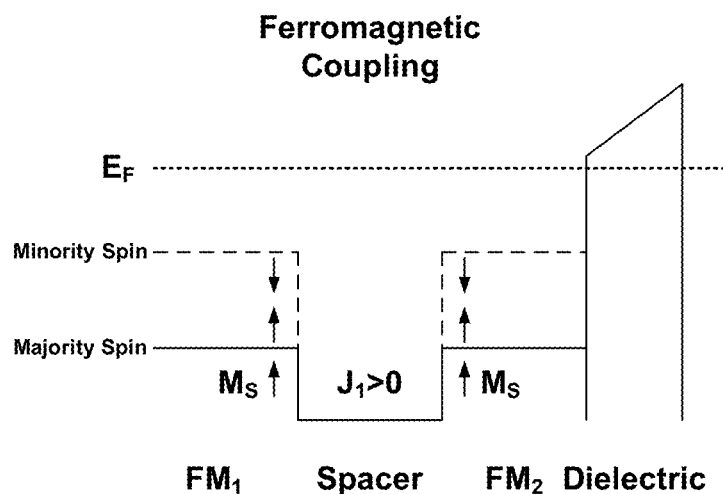
FIGS. 2A and 2B are conceptual diagrams illustrating examples of the layer stack of FIG. 1 under ferromagnetic coupling and anti-ferromagnetic coupling, respectively.
Figure 2B:
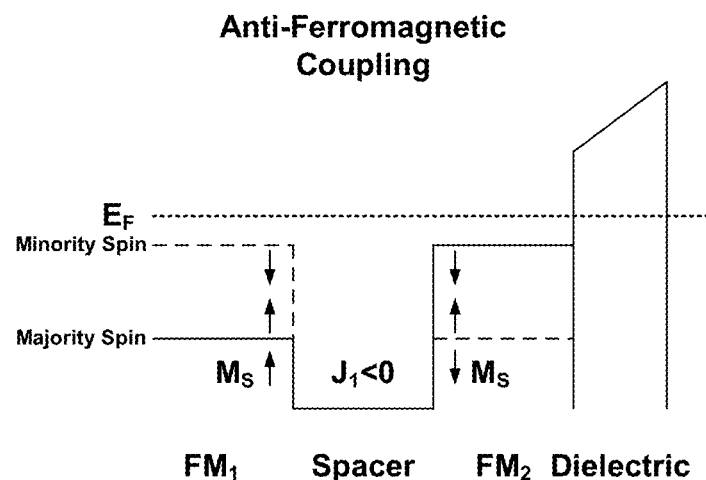

FIGS. 2A and 2B are conceptual diagrams illustrating examples of the layer stack of FIG. 1 under ferromagnetic coupling and anti-ferromagnetic coupling, respectively. As shown in FIG. 2A, when a negative bias voltage is applied by voltage source 24 to seedlayer/first electrode 12, $E_F$ is shifted upwards and electrons accumulate at the interface of second ferromagnetic layer 18 and dielectric barrier layer 20. The minority spin density (d orbitals) is enhanced and first ferromagnetic layer 14 and second ferromagnetic layer 18 are ferromagnetically coupled. Further, the IEC ($J_1$) is positive.

As shown in FIG. 2B, when a positive bias voltage is applied by voltage source 24 to seedlayer/first electrode 12, $E_F$ is shifted downward and electrons deplete at the interface of second ferromagnetic layer 18 and dielectric barrier layer 20. The minority spin density (d orbitals) is reduced and first ferromagnetic layer 14 and second ferromagnetic layer 18 are antiferromagnetically coupled. Further, the IEC ($J_1$) is negative.

Figure 3:
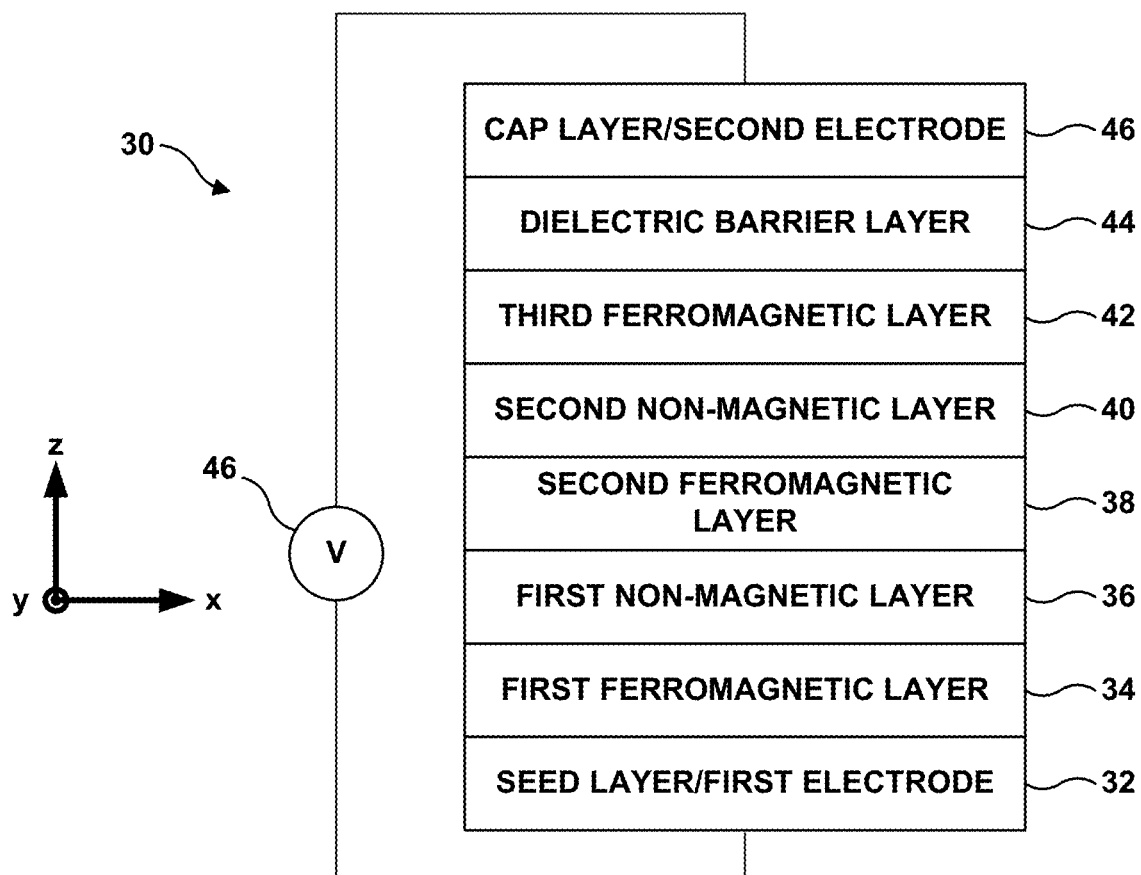
FIG. 3 is a conceptual block diagram of a layer stack that includes a composite free layer with a dual synthetic antiferromagnetic structure, in accordance with examples of the disclosure.

In some examples, a layer stack may include an additional ferromagnetic layer such that a free layer is formed from dual SAF. FIG. 3 is a conceptual block diagram of a layer stack 30 that includes a composite free layer with a dual synthetic antiferromagnetic structure, in accordance with examples of the disclosure. Layer stack 30 includes a seed layer/first electrode 32, a first ferromagnetic layer 34 on seed layer/first electrode 32, a first non-magnetic layer (as a spacer) 36 on first ferromagnetic layer 34, a second ferromagnetic layer 38 on first non-magnetic layer 36, a second non-magnetic layer (as a spacer) 40 on second ferromagnetic layer 38, a third ferromagnetic layer 42 on second non-magnetic layer 40, a dielectric barrier layer 44 on third ferromagnetic layer 42, and a cap layer/second electrode 44 on third ferromagnetic layer 42. Seed layer/first electrode 32, first ferromagnetic layer 34, dielectric barrier layer 44, and cap layer/second electrode 46 may be similar to or substantially the same as seed layer/first electrode 12, first ferromagnetic layer 14, dielectric barrier layer 20, and cap layer/second electrode 22 of layer stack 10 of FIG. 1.

First non-magnetic layer 36 and second non-magnetic layer 40 may be similar to or substantially the same as non-magnetic layer 16 of layer stack 10 of FIG. 1. First non-magnetic layer 36 and second non-magnetic layer 40 may be the same or different. For example, first non-magnetic layer 36 and second non-magnetic layer 40 may be formed of the same or different materials, and may define the same or different thicknesses. The compositions and thicknesses of first non-magnetic layer 36 and second non-magnetic layer 40 may be selected to achieve a desired type and strength of magnetic coupling between first ferromagnetic layer 34 and second ferromagnetic layer 38 and between second ferromagnetic layer 38 and third ferromagnetic layer 42, respectively. For example, a thickness of first non-magnetic layer 36 and a thickness of second non-magnetic layer 40 may be selected so that first ferromagnetic layer 34 and second ferromagnetic layer 38 are antiferromagnetically coupled in the absence of a bias voltage and second ferromagnetic layer 38 and third ferromagnetic layer 42 are also antiferromagnetically coupled in the absence of a bias voltage. In some examples, a thickness of second non-magnetic layer 40 may be selected so that the IEC between second ferromagnetic layer 38 and third ferromagnetic layer 42 is less in magnitude than the IEC between first ferromagnetic layer 34 and second ferromagnetic layer 38. This may result in magnetization of third ferromagnetic layer 42 switching at a lower bias voltage than magnetization of second ferromagnetic layer 38 and first ferromagnetic layer 34. Thus, by selection of an appropriate bias voltage (e.g., greater than a voltage that causes magnetization of third ferromagnetic layer 42 to switch and less than a voltage that causes magnetizations of second ferromagnetic layer 38 and first ferromagnetic layer 34 to switch) can be used to switch magnetic orientation of third ferromagnetic layer 42.

Second ferromagnetic layer 38 may be similar to or substantially the same as first ferromagnetic layer 14 of layer stack 10 in FIG. 1. First ferromagnetic layer 34 and second ferromagnetic layer 38 may be the same or different. For example, first non-magnetic layer 36 and second non-magnetic layer 40 may be formed of the same or different materials, and may define the same or different thicknesses. The compositions and thicknesses of first ferromagnetic layer 34 and second ferromagnetic layer 38 may be selected to achieve a desired type and strength of magnetic coupling between first ferromagnetic layer 34 and second ferromagnetic layer 38. For example, compositions and thicknesses of first ferromagnetic layer 34 and second ferromagnetic layer 38 may be selected to achieve relatively strong antiferromagnetic IEC between first ferromagnetic layer 34 and second ferromagnetic layer 38 so that magnetic orientations of first ferromagnetic layer 34 and second ferromagnetic layer 38 do not switch under the influence of the bias voltages applied by voltage source 46. In this way, first ferromagnetic layer 34, first non-magnetic layer 36, and second ferromagnetic layer 38 may form a relatively stable synthetic antiferromagnet (SAF) structure in which the IEC ($J_1$) is negative.

Third ferromagnetic layer 42 may include compositions similar to second ferromagnetic layer 18 of layer stack 10 of FIG. 1. For example, third ferromagnetic layer 42 may include a CoFeB alloy, such as $Co_{20}Fe_{60}B_{20}$; a CoFe alloy, Co, Fe, a Co-based Heusler alloy, or a Mn-based Heusler alloy. Third ferromagnetic layer 42 may define any suitable thickness, such as between about 0.5 nm and about 10 nm, such as between about 1 nm and about 4 nm, or about 2 nm. In some examples, third ferromagnetic layer 42 includes a CoFeB alloy and a thickness of about 1.3 nm.

The composition and thickness of third ferromagnetic layer 42 may be selected to achieve a desired type and strength of magnetic coupling between second ferromagnetic layer 38 and third ferromagnetic layer 42. For example, compositions and thicknesses of second ferromagnetic layer 38 and third ferromagnetic layer 42 may be selected to achieve relatively weaker antiferromagnetic IEC between second ferromagnetic layer 38 and third ferromagnetic layer 42 than between first ferromagnetic layer 34 and second ferromagnetic layer 38 so that the magnetic orientation of third ferromagnetic layer 42 switches under the influence of the bias voltages applied by voltage source 46. In this way, second ferromagnetic layer 38, second non-magnetic layer 40, and third ferromagnetic layer 42 may form a relatively less stable synthetic antiferromagnet (SAF) structure in which the IEC ($J_1$) is negative in the absence of a bias voltage.

Upon application of a bias voltage may tune the magnetic anisotropy of third ferromagnetic layer 42 and magnetic coupling between second ferromagnetic layer 38 and third ferromagnetic layer 42 from antiferromagnetic (IEC between second ferromagnetic layer 38 and third ferromagnetic layer 42, $J_2$, is less than 0) and ferromagnetic (IEC between second ferromagnetic layer 38 and third ferromagnetic layer 42, $J_2$, is greater than 0). This may be similar to operation of layer stack 10 of FIG. 1 as shown in FIGS. 2A and 2B, aside from the presence of the stable SAF formed by first ferromagnetic layer 34, first non-magnetic layer 36, and second ferromagnetic layer 38.

Figure 4:
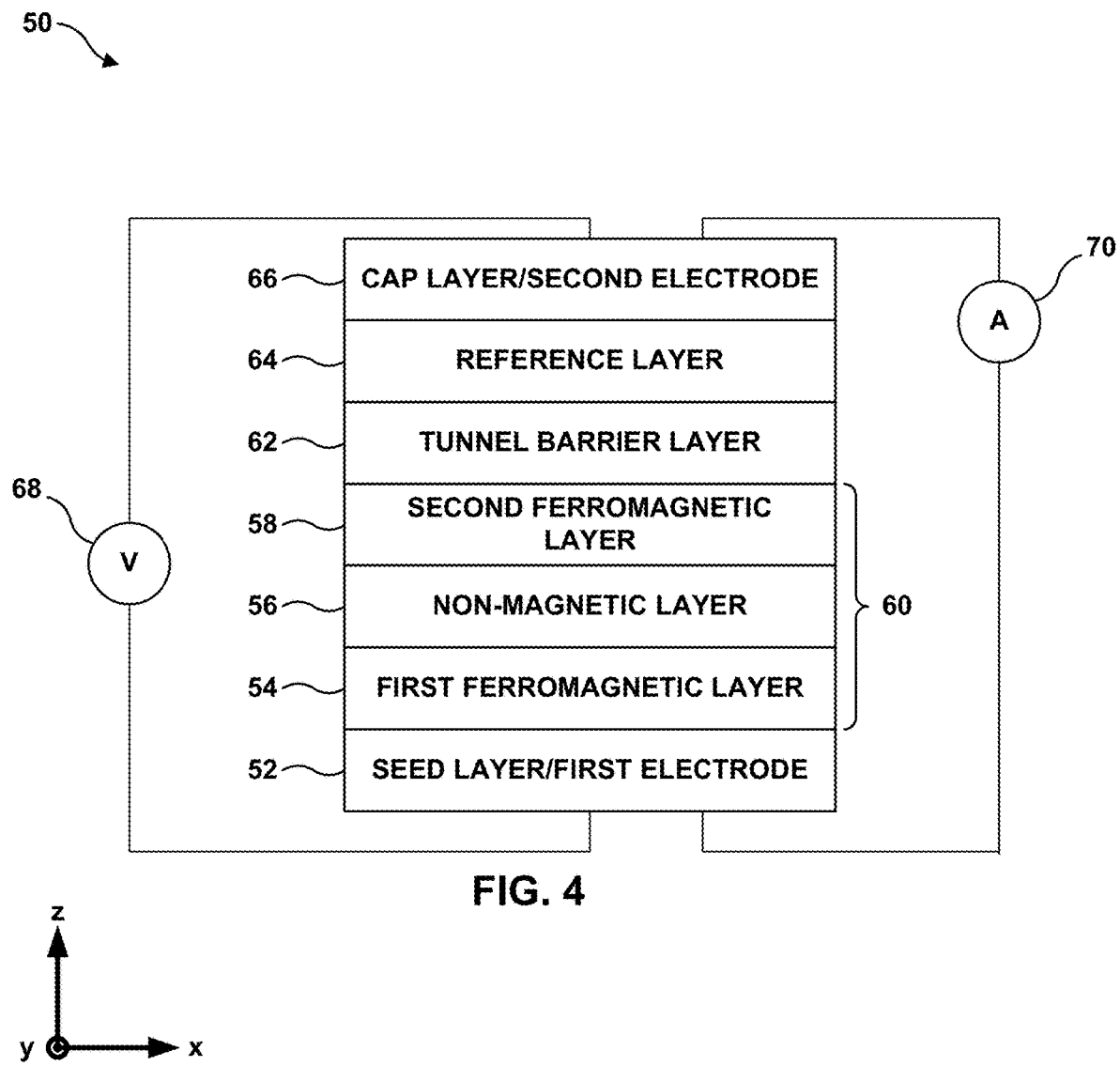
FIG. 4 is a conceptual block diagram of a perpendicular magnetic tunnel junction that includes a synthetic antiferromagnet free layer, in accordance with examples of the disclosure.

Due to the bidirectional switching of the perpendicular composite free layers with SAF structures shown in FIGS. 1 and 3, the perpendicular composite free layers may be incorporated in perpendicular magnetic tunnel junctions (p-MTJs). FIG. 4 is a conceptual block diagram of an example p-MTJ 50 that includes a synthetic antiferromagnet free layer, in accordance with examples of the disclosure. Like layer stack 10 of FIG. 1, p-MTJ 50 of FIG. 4 includes a seed layer/first electrode 52, a first ferromagnetic layer 54 on seed layer/first electrode 52, a non-magnetic layer 56 on first ferromagnetic layer 54, and a second ferromagnetic layer 58 on non-magnetic layer 56. Seed layer/first electrode 52, first ferromagnetic layer 54, non-magnetic layer 56, and second ferromagnetic layer 58 may be similar to or substantially the same as seed layer/first electrode 12, first ferromagnetic layer 14, non-magnetic layer 16, and second ferromagnetic layer 18 of layer stack 10 of FIG. 1. Together, first ferromagnetic layer 54, non-magnetic layer 56, and second ferromagnetic layer 58 form a synthetic antiferromagnet (SAF) free layer 60.

Unlike layer stack 10 of FIG. 1, p-MTJ 50 of FIG. 4 includes a tunnel barrier layer 62 on second ferromagnetic layer 58 and a reference layer 64 on tunnel barrier layer 62. Tunnel barrier layer 62 may include an electrically insulating material, such as MgO, $AlO_x$, or $MgAlO_x$, though which electrons must tunnel to conduct charge from SAF free layer 60 to reference layer 64. Tunnel barrier layer 62 may define a thickness on the order of single digit nanometers, such as between about 1 nm and about 2.5 nm, or about 2 nm.

Reference layer 64 includes a ferromagnetic or ferrimagnetic material whose magnetic moment is substantially fixed for electric fields, bias voltages, magnetic fields, spin transfer torque (STT), or spin orbit torque (SOT) to which reference layer 64 is exposed during operation of p-MTJ 50. Reference layer 64 may include any suitable ferromagnetic or ferrimagnetic material. In some examples, may include, for example, a CoFeB alloy, such as $Co_{20}Fe_{60}B_{20}$; a CoFe alloy, Co, Fe, a Co-based Heusler alloy, or a Mn-based Heusler alloy, FePd, FePt, FePdPt, Co—Pd, Co—Pt, CoPdPt, FeNiPd, FeNiPt, MnAl, or the like. Reference layer 64 may define any suitable thickness, such as between about 1 nm and about 12 nm, such as between about 1 nm and about 4 nm, or about 2 nm, or between about 3 nm and about 12 nm. In some examples, reference layer 64 includes a CoFeB alloy and a thickness of about 1.3 nm. In some examples, reference layer 64 may include multiple layers, such as a ferromagnetic or ferrimagnetic layer antiferromagnetically coupled to an antiferromagnetic layer.

P-MTJ 50 also includes a cap layer/second electrode 66, which may be similar to or substantially the same as cap layer/second electrode 22 of layer stack 10 of FIG. 1.

During operation of p-MTJ 50, a write controller may control voltage source 68 to apply a bias voltage of a selected sign and magnitude across p-MTJ 50. As described above with reference to FIG. 1, the bias voltage may affect magnetic anisotropy of second ferromagnetic layer and a sign of IEC associated with spacer layer 56. Thus, the bias voltage may cause switching of magnetic orientation of second ferromagnetic layer 58. The magnetic orientation of second ferromagnetic layer 58 affects the resistance of p-MTJ 50, which may be read by conducting a current from current source 70 through p-MTJ 50.

Figure 5:
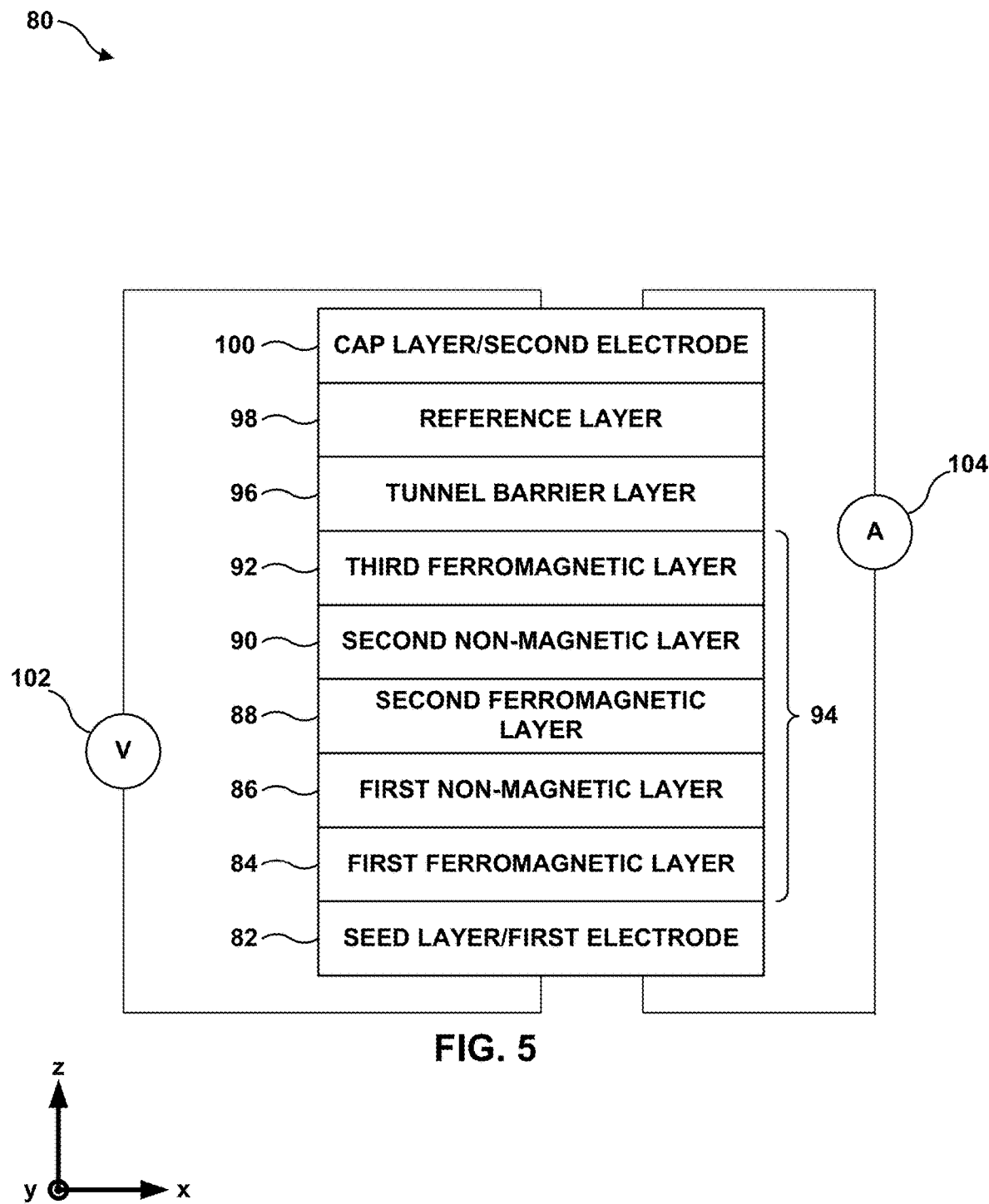
FIG. 5 is a conceptual block diagram of a perpendicular magnetic tunnel junction that includes a dual synthetic antiferromagnet free layer, in accordance with examples of the disclosure.

In some examples, a p-MTJ may include the layer stack 30 shown in FIG. 3. For example, FIG. 5 is a conceptual block diagram of a p-MTJ 80 that includes a dual SAF free layer 94, in accordance with examples of the disclosure. Like layer stack 30 of FIG. 3, p-MTJ 80 of FIG. 5 includes a seed layer/first electrode 82, a first ferromagnetic layer 84 on seed layer/first electrode 82, a first spacer layer 86 on first ferromagnetic layer 84, a second ferromagnetic layer 88 on first non-magnetic layer 86, a second non-magnetic layer 90 on second ferromagnetic layer 88, and a third ferromagnetic layer 92 on second non-magnetic layer 90. Seed layer/first electrode 82, first ferromagnetic layer 84, first non-magnetic layer 86, second ferromagnetic layer 88, second non-magnetic layer 90, and third ferromagnetic layer 90 may be similar to or substantially the same as seed layer/first electrode 32, first ferromagnetic layer 34, first non-magnetic layer 36, second ferromagnetic layer 38, second non-magnetic layer 40, and third ferromagnetic layer 42 of layer stack 30 of FIG. 3. Together, first ferromagnetic layer 84, first non-magnetic layer 86, second ferromagnetic layer 88, second non-magnetic layer 90, and third ferromagnetic layer 92 form a dual SAF free layer 94.

Unlike layer stack 30 of FIG. 3, p-MTJ 80 of FIG. 5 includes a tunnel barrier layer 96 on third ferromagnetic layer 92 and a reference layer 98 on tunnel barrier layer 96. Tunnel barrier layer 96 and reference layer 98 may be similar to or substantially the same as tunnel barrier layer 62 and reference layer 64 of p-MTJ 50 of FIG. 4. P-MTJ 80 also includes a cap layer/second electrode 100, which may be similar to or substantially the same as cap layer/second electrode 46 of layer stack 30 of FIG. 3.

Figure 6A:
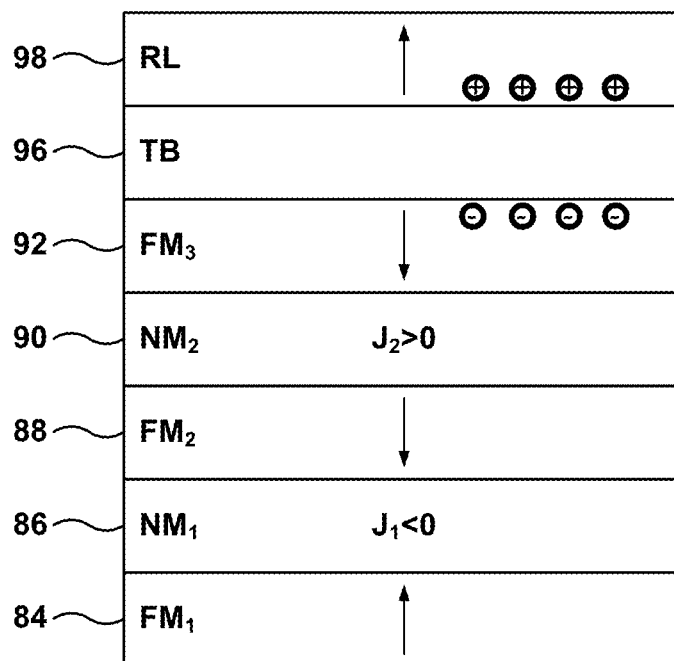
FIGS. 6A and 6B are conceptual diagrams illustrating examples of the layer stack of FIG. 5 under a positive bias voltage and a negative bias voltage, respectively.
Figure 6A:
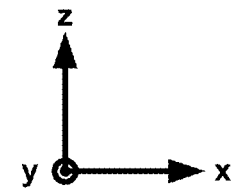
Figure 6B:
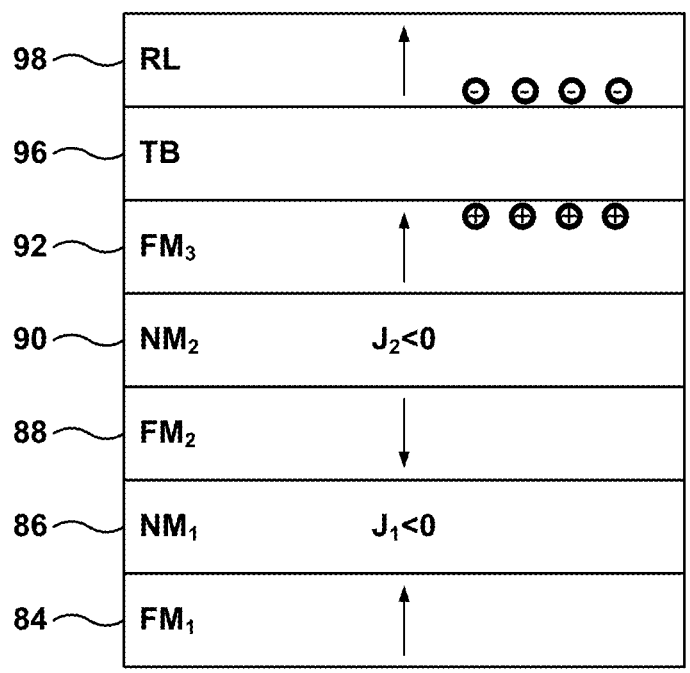
Figure 6B:
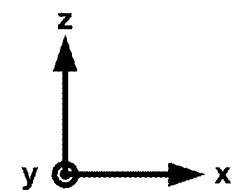

FIGS. 6A and 6B are conceptual diagrams illustrating examples of p-MTJ 80 of FIG. 5 under a positive bias voltage from voltage source 102 and a negative bias voltage from voltage source 102, respectively. As shown in FIG. 6A, first ferromagnetic layer 84 may have a magnetic orientation in the positive z-axis direction of FIG. 6A and second ferromagnetic layer 88 may have a magnetic orientation in the negative z-axis direction of FIG. 6A. First non-magnetic layer 86 has a negative IEC energy ($J_1 < 0$), indicating that first ferromagnetic layer 84 and second ferromagnetic layer 88 are antiferromagnetically coupled.

The positive bias voltage causes accumulation of electrons from the interface of third ferromagnetic layer 92 and tunnel barrier layer 96, as shown by the negative charges accumulated at the interface. The accumulation of electrons at the interface of third ferromagnetic layer 92 and tunnel barrier layer 96 causes a reduction in the minority spin density (d orbitals) and second ferromagnetic layer 88 and third ferromagnetic layer 92 are ferromagnetically coupled. Further, the IEC ($J_1$) is positive, making the ferromagnetic coupling the energetically stable state.

As shown in FIG. 6B, when a negative bias voltage is applied by voltage source 102 to seedlayer/first electrode 82, electrons deplete at the interface of third ferromagnetic layer 92 and tunnel barrier layer 96. The depletion of electrons at the interface enhances the minority spin density (d orbitals) and second ferromagnetic layer 88 and second ferromagnetic layer 92 are anti-ferromagnetically coupled. Further, the IEC ($J_1$) is negative, making the anti-ferromagnetic coupling the energetically stable state.

Figure 7:
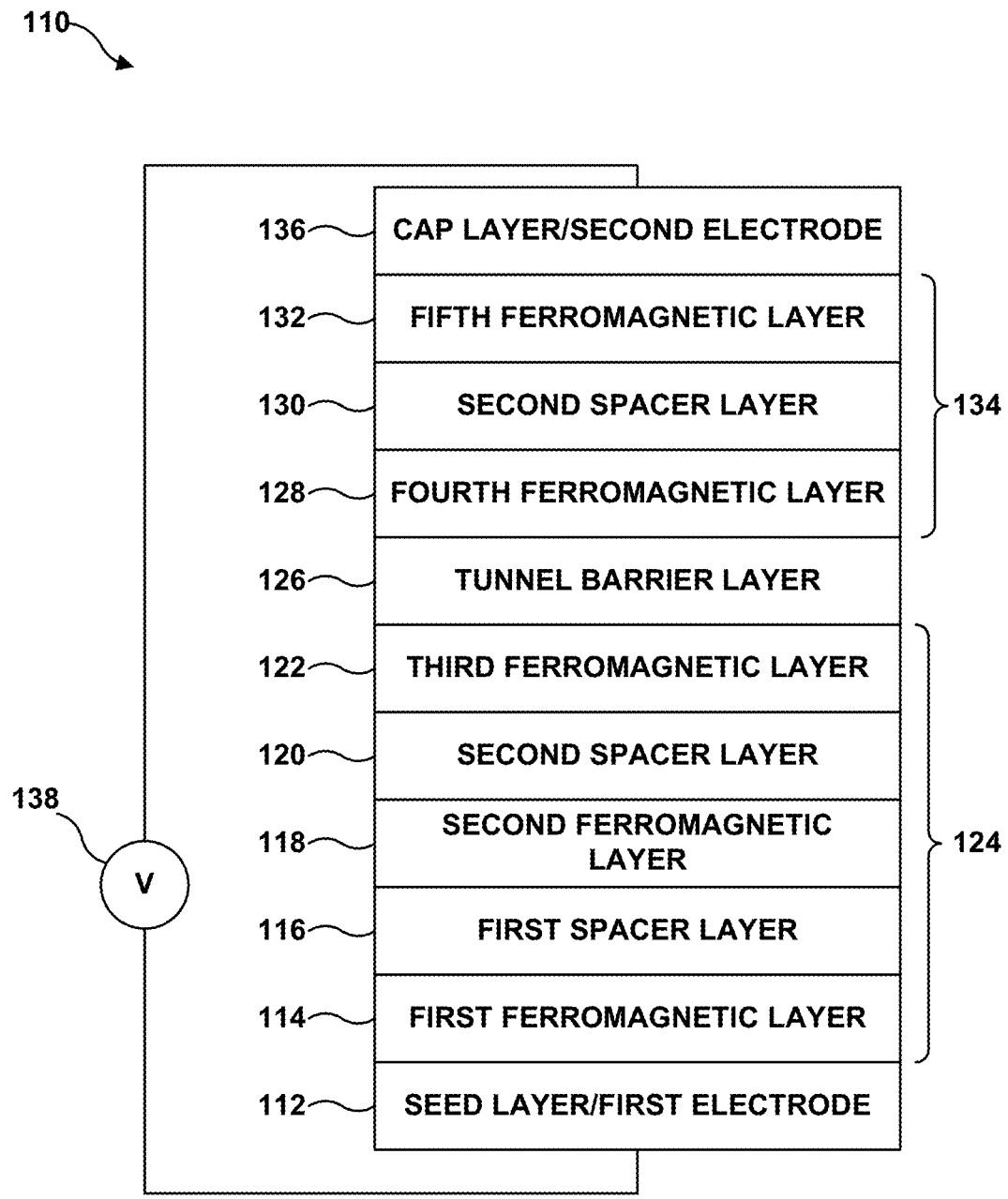
FIG. 7 is a conceptual block diagram of a perpendicular magnetic tunnel junction that includes a dual synthetic antiferromagnet free layer and a synthetic antiferromagnet reference layer, in accordance with examples of the disclosure.

In some examples, the top reference layer (e.g., reference layer 98) induces a large stray field, which may reduce the thermal stability and increase $J_c$ of the p-MTJ, such as p-MTJ 50 or 80. This may be addressed by using a SAF reference layer, which can significantly reduce $J_c$ and enhance thermal stability. FIG. 7 is a conceptual block diagram of a p-MTJ that includes a dual SAF free layer and a SAR reference layer, in accordance with examples of the disclosure. Like P-MTJ 80 of FIG. 5, p-MTJ 110 of FIG. 7 includes a seed layer/first electrode 112, a first ferromagnetic layer 114 on seed layer/first electrode 112, a first spacer layer 116 on first ferromagnetic layer 114, a second ferromagnetic layer 118 on first non-magnetic layer 116, a second non-magnetic layer 120 on second ferromagnetic layer 118, and a third ferromagnetic layer 122 on second non-magnetic layer 120, and a tunnel barrier layer 126 on third ferromagnetic layer 122. Together, first ferromagnetic layer 114, first non-magnetic layer 116, second ferromagnetic layer 118, second non-magnetic layer 120, and third ferromagnetic layer 122 form a dual SAF free layer 124. Seed layer/first electrode 112, first ferromagnetic layer 114, first non-magnetic layer 116, second ferromagnetic layer 118, second non-magnetic layer 120, third ferromagnetic layer 122, and tunnel barrier layer 126 may be similar to or substantially the same as seed layer/first electrode 82, first ferromagnetic layer 84, first non-magnetic layer 86, second ferromagnetic layer 88, second non-magnetic layer 90, third ferromagnetic layer 92, and tunnel barrier layer 96 of p-MTJ 80 of FIG. 5.

Unlike p-MTJ 80 of FIG. 5, p-MTJ 110 of FIG. 7 includes a SAF reference layer 134, which includes a fourth ferromagnetic layer 128, a third non-magnetic layer 130 on fourth ferromagnetic layer 128, and a fifth ferromagnetic layer 132 on third non-magnetic layer 130. Fourth ferromagnetic layer 128 may be similar to or substantially the same as third ferromagnetic layer 122, third non-magnetic layer 130 may be similar to or substantially the same as first non-magnetic layer 116 or second non-magnetic layer 120, and fifth ferromagnetic layer 132 may be similar to or substantially the same as first ferromagnetic layer 114 or second ferromagnetic layer 118. Fourth ferromagnetic layer 128 is antiferromagnetically coupled to fifth ferromagnetic layer 132. The antiferromagnetic coupling may be designed to be sufficiently strong that a magnetic orientation of SAF reference layer 134 does not change for electric fields, bias voltages, magnetic fields, spin transfer torque (STT), or spin orbit torque (SOT) to which SAF reference layer 134 is exposed during operation of p-MTJ 110. A SAF reference layer 134 may generate a smaller stray field than a reference layer that includes a single ferromagnetic or ferrimagnetic layer.

In some examples, the layer stacks or MTJs described herein may be used as spin memory or logic devices. For example, the layer stacks or MTJs described herein may be used as spin memory or logic devices for magnetoresistive random access memory.

Figure 17:
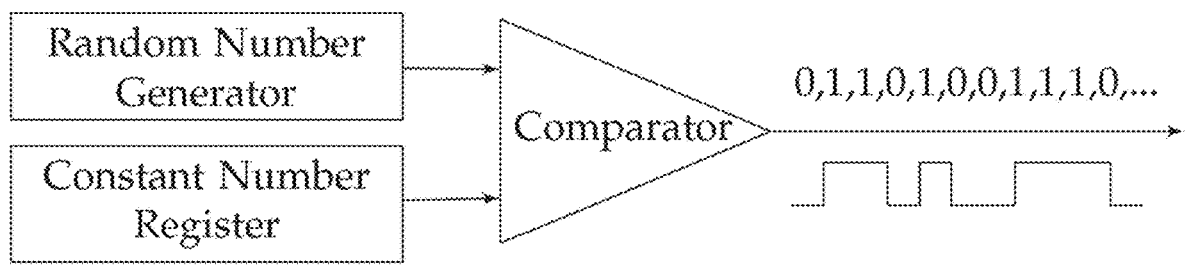
FIG. 17 is a conceptual diagram of a stochastic number generator configured to generate a stochastic bit stream.

In some examples, the layer stacks or MTJs described herein may be used as random bit stream generators. For example, the layer stacks or MTJs described herein may be used as random bit stream generators for stochastic computing devices or stochastic spiking neural network devices. FIG. 17 is a conceptual diagram of a stochastic number generator configured to generate a stochastic bit stream. The stochastic number generator includes a random number generator and a constant number register. The outputs of the random number generator and the constant number register are input to a comparator, which outputs a stochastic bit stream. The layer stacks or MTJs described herein may be used as the random number generator in the stochastic number generator of FIG. 17.

EXAMPLES

To demonstrate E-field switching of p-MTJs with a composite SAF free layer, a FePd SAF p-MTJ stack was fabricated. The p-MTJ stack was prepared on single crystalline (001) MgO substrate using a magnetron sputtering system under ultra-high vacuum (base pressure $<5.0 \times 10^{-8}$ Torr). The metal layers were deposited by DC sputtering and the MgO tunnel barrier layer was deposited by RF sputtering. The p-MTJ stack had the configuration shown in FIG. 8A. A 15 nm layer of Cr was deposited on the MgO substrate and a 5 nm layer of Pt was deposited on the 15 nm layer of Cr to form a seed structured. The seed structure was deposited while the MgO substrate was maintained at a temperature of about 350° C.

A 3 nm layer of FePd was deposited on the 5 nm layer of Pt, a 1.1 nm layer of Ru was deposited on the 3 nm layer of FePd, and a 3 nm layer of FePd was deposited on the 1.1 nm layer of Ru. Together, the 3 nm layer of FePd/1.1 nm layer of Ru/3 nm layer of FePd formed a perpendicular synthetic antiferromagnetic stack. The layers of the synthetic antiferromagnetic stack were deposited while the MgO substrate was maintained at a temperature of about 350° C.

The remaining layers were deposited after the MgO substrate cooled to room temperature. A 0.8 nm layer of Ta was deposited on the 3 nm layer of FePd and a 1.3 nm layer of $Co_{20}Fe_{60}B_{20}$ was deposited on the 0.8 nm layer of Ta. Together, the 3 nm layer of FePd/1.1 nm layer of Ru/3 nm layer of FePd/0.8 nm layer of Ta/1.3 nm layer of $Co_{20}Fe_{60}B_{20}$ formed a dual SAF free layer. A tunnel barrier layer of 2 nm of MgO was deposited on the 1.3 nm layer of $Co_{20}Fe_{60}B_{20}$. A reference layer was then formed on the tunnel barrier layer. The reference layer included a 1.3 nm layer of $Co_{20}Fe_{60}B_{20}$ on the tunnel barrier layer, a non-magnetic layer of 0.7 nm Ta on the 1.3 nm layer of $Co_{20}Fe_{60}B_{20}$, and a multilayer stack including 5 pairs of [0.7 nm Pd/0.3 nm Co] on the 0.7 nm layer of Ta. A 5 nm layer of Ta as a capping layer was on the multilayer stack.

Figure 8A:
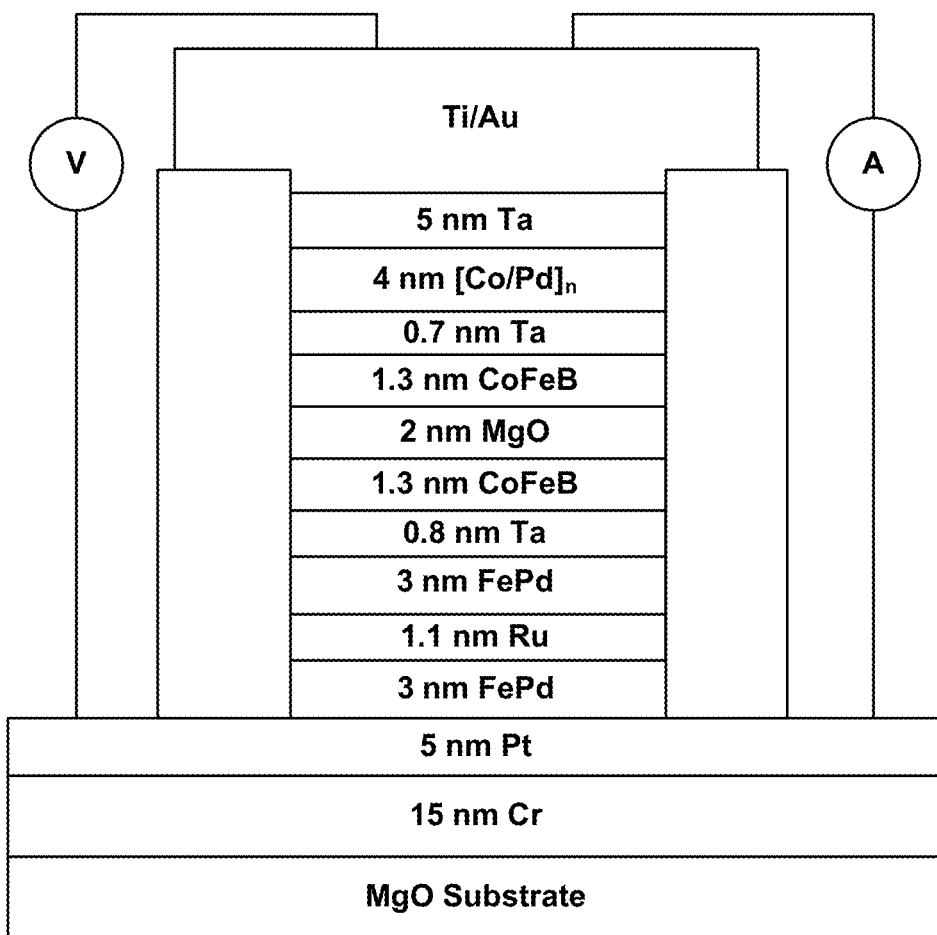
FIG. 8A is a conceptual and schematic diagram of an example perpendicular magnetic tunnel junction including a dual synthetic anti-ferromagnet free layer and a reference layer.

The capping layer depended on the tests to which the p-MTJ was to be subjected. For p-MTJs to be tested using four-probe tests, a capping layer of 5 nm Ta was used, as shown in FIG. 8A. For p-MTJs to be tested using conductive atomic force microscopy (C-AFM), the capping layer was 15 nm of Pt.

Before device patterning, the p-MTJs were annealed at 350° C. and 400° C. using rapid thermal annealer. The p-MTJs were patterned into nano-pillars using e-beam lithography and Ar ion milling. Electrical contacts were formed on the capping layer from a 10 nm layer of Ti and a 120 nm layer of Au on the 10 nm layer of Ti. The spin transport properties were tested by four-probe technique for 150-nm and 500-nm diameter p-MTJs using a Dynacool PPMS at different temperatures. Spin transport properties were tested for 35-100 nm diameter FePd SAF p-MTJs using a C-AFM setup at room temperature.

The C-AFM equipment was an RHK UHV350 with R9 controller operating in contact mode. Si-doped AFM probe tips from Arrow-FM nanoworld were made conductive by sputtering a layer of Pt with a 200 nm nominal thickness on a Ta adhesion layer. A sharp AFM tip with 20 nm of conductive Pt coated was used to make electrical contact directly with the top of FePd SAF p-MTJ pillars. In all the measurements, the tip was grounded and the bias voltage (positive or negative) was applied at the bottom seed layer. Thus, for a positive bias voltage ($V_{bias}$), the current flowed from the bottom to the top of the p-MTJ stack, and for a negative $V_{bias}$, the current flowed from the top to the bottom of p-MTJ stack.

During the testing, a sweep rate of 150 Oe/sec was used to measure the resistance versus magnetic field (R-H) loops. A sweep rate of 500 mV/sec was used to measure the resistance versus bias voltage (R-V) loops. For resistance versus time (R-t) traces, an acquisition rate of 1 MHz was used. A variable out-of-plane magnetic field $H_{ext}$ up to 1300 Oe was applied by an electromagnet directly below the sample stage.

In the bottom dual SAF free layer of FIG. 8A, two $L1_0$-FePd layers are antiferromagnetically coupled through a Ru non-magnetic spacer layer. The magnetic anisotropy and interlayer exchange coupling strength ($J_{IEC}$) of the FePd/Ru/FePd p-SAF structure were calculated to be about $1.0 \times 10^7$ erg/cm$^3$ and about $-2.60$ erg/cm$^2$, respectively. As shown in FIG. 8A, the FePd/Ru/FePd p-SAF structure then couples with a CoFeB layer through a Ta layer, which also exhibits AFM coupling. Besides functioning as a spacer layer, the Ta layer also enhances the i-PMA of the CoFeB ferromagnetic layer with the MgO tunnel barrier layer.

Figure 8B:
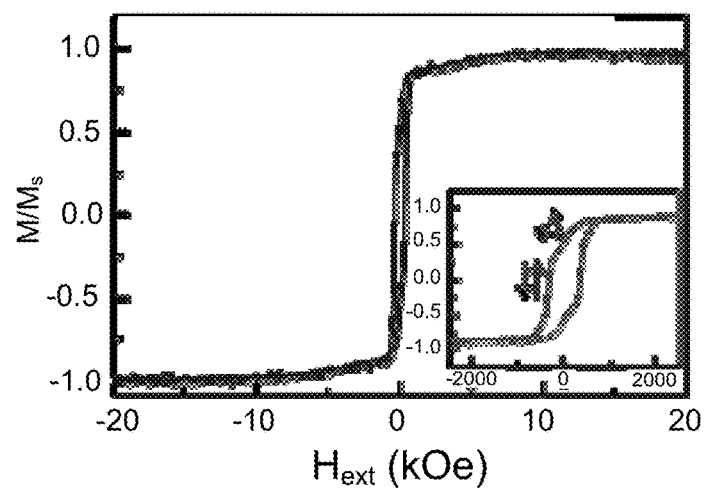
FIG. 8B is a plot of an out-of-plane magnetic hysteresis (M-H) loop of a dual p-synthetic anti-ferromagnet free layer with a stack of FePd(3 nm)/Ru(1.1 nm)/FePd(3 nm)/Ta(0.8 nm)/CoFeB(1.3 nm).
Figure 9:
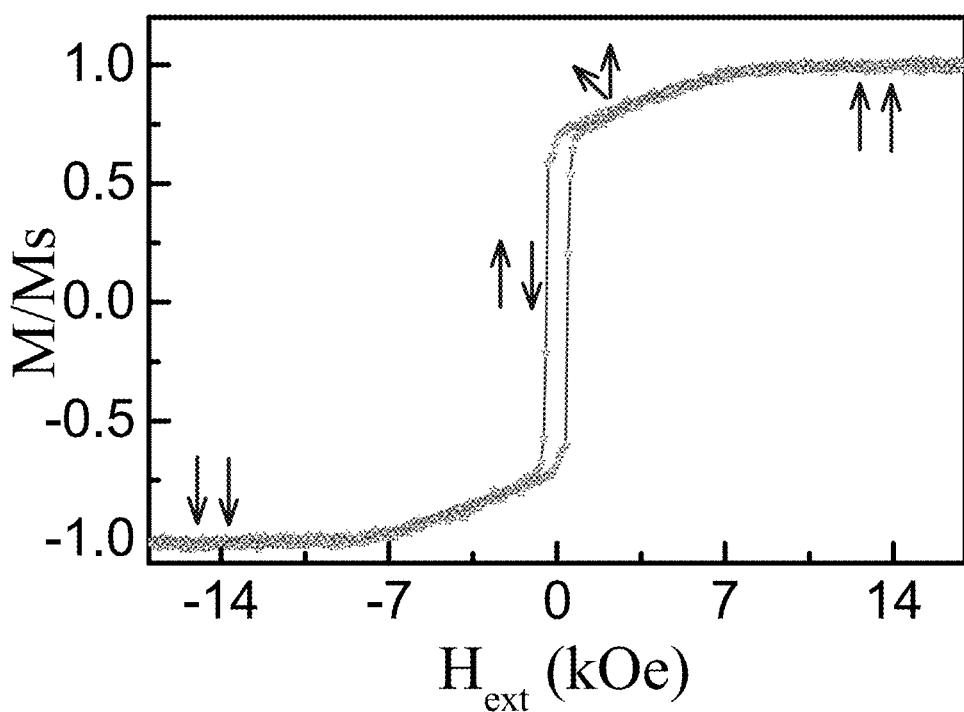
FIG. 9, is a plot of an out-of-plane magnetic hysteresis (M-H) loop of a FePd p-synthetic anti-ferromagnet free layer with a stack of FePd(3 nm)/Ru(1.1 nm)/FePd(3 nm)).

FIG. 8B is a plot of an out-of-plane magnetic hysteresis (M-H) loop of a dual p-SAF free layer with a stack of FePd(3 nm)/Ru(1.1 nm)/FePd(3 nm)/Ta(0.8 nm)/CoFeB(1.3 nm). The plot of FIG. 8B was generated after annealing the layers at 350° C. The inset of FIG. 8B shows the minor M-H loop of the dual p-SAF structure, where anti-ferromagnetic coupling was observed between FePd and CoFeB layers. As shown in FIG. 8B, good anti-ferromagnetic coupling was observed among the three ferromagnetic layers (FePd, FePd, and CoFeB). This is further illustrated in FIG. 9, which shows the out-of-plane magnetic hysteresis (M-H) loop of a FePd p-SAF free layer with a stack of FePd(3 nm)/Ru(1.1 nm)/FePd(3 nm). FIG. 9 shows that spin-flop switching and spin-flip switching are observed at a high and low applied magnetic field, respectively. The FePd/Ru/FePd p-SAF shows the strongest interlayer exchange coupling property with a strength $J_{IEC}$ of about $-2.60$ erg/cm$^2$. The FePd/Ta/CoFeB structure shows comparatively weak AFM coupling with an obvious two-step switching, as shown in the inset of FIG. 8B.

Figure 8C:
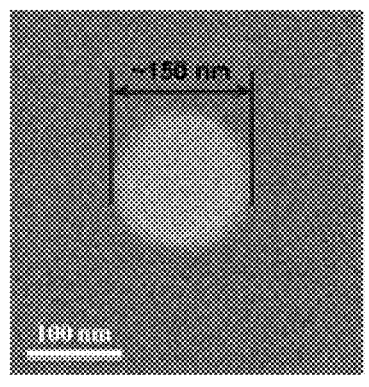
FIG. 8C is a microscopy image of a 150-nm diameter perpendicular magnetic tunnel junction pillar.
Figure 10:
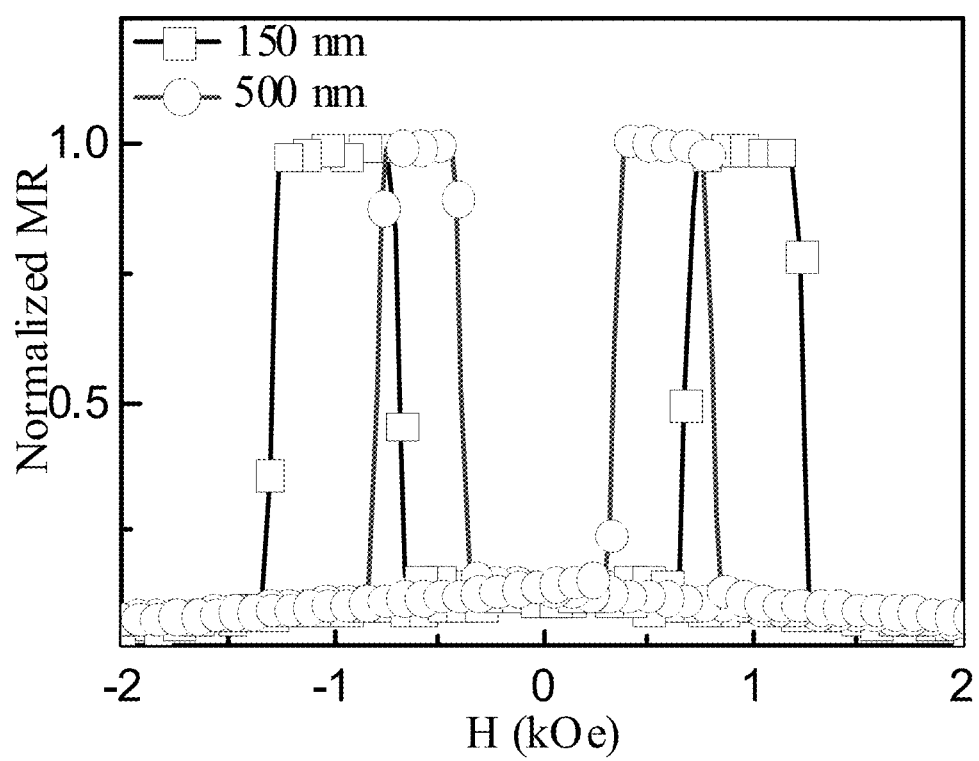
FIG. 10 is a plot of normalized magnetoresistance versus applied field for FePd synthetic antiferromagnet perpendicular magnetic tunnel junctions with 150 and 500 nm diameter.

Subsequently, the p-MTJ stacks shown in FIG. 8A were patterned into 150-nm diameter p-MTJ pillars using e-beam lithography and Ar ion milling. FIG. 8C is a microscopy image of the 150-nm diameter p-MTJ pillar. The spin-transport properties (magnetoresistance versus external magnetic field, MR-H) of FePd SAF p-MTJs annealed at 350° C. were measured by a standard four-probe resistance measurement technique by using a Dynacool physical properties measurement system (PPMS). FIG. 10 is a plot of normalized magnetoresistance versus applied field for p-MTJs with 150 nm and 500 nm diameter and SAF free layers at room temperature. As shown in FIG. 10, the switching field ($H_{swf}$) of the dual p-SAF free layer increased from about 390 Oe to about 700 Oe when the diameter of p-MTJ pillar was decreased from about 500 nm to about 150 nm.

Figure 8D:
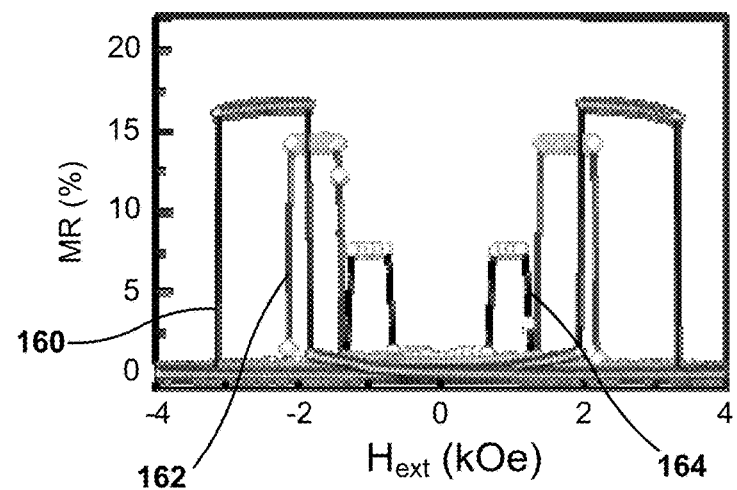
FIG. 8D is a plot illustrating magnetoresistance-applied field loops as a function of the temperature for perpendicular magnetic tunnel junctions with 150 nm diameter and synthetic antiferromagnet free layers.

FIG. 8D is a plot illustrating magnetoresistance-applied field loops as a function of temperature for p-MTJs with 150 nm diameter and SAF free layers. The magnetoresistance-applied field loops were obtained at 5 K (loop 160), 100 k (loop 162), and 300 K (loop 164). Each of the loops 160, 162, 164 exhibited a plateau in the high-resistance state and sharp magnetization switching between the parallel and anti-parallel states while sweeping the applied perpendicular external magnetic field ($N_{ext}$), implying that both the free and reference layer structures possess good perpendicular magnetic anisotropy. The magnetoresistance ratio is calculated to be about 8.0% at 300 K and about 16.0% at 5 K. A resistance-area (RA) product of about 30 k$\Omega$*$\mu m^2$ is obtained with a 2-nm-thick MgO tunnel barrier.

To quantitatively evaluate the E-field effect for the dual p-SAF free layer of p-MTJs, the mean $H_{swf}$, magnetic anisotropy ($K_{u,eff}$), and coefficiency ($\xi$) of the voltage-controlled magnetic anisotropy (VCMA) of the dual p-SAF free layer were obtained by measuring minor M-H loops and fitting the switching field distribution (SFD). The 350° C.-annealed FePd SAF p-TMJ stacks were patterned into sub-100 nm diameter MTJ pillars by using an e-beam lithography and Ar ion etching. FIGS. 11A-11C illustrate a scanning electron microscopy (SEM) image of a top view of the 350° C.-annealed FePd SAF p-TMJ stacks with diameters ranging from about 35 nm to about 250 nm, an atomic force microscopy (AFM) image illustrating topography of the pillars, and a current map measured by conductive AFM at 100 mV, respectively.

The minor MR-H loop of the sub-100 nm FePd SAF p-MTJ devices was measured using a conductive atomic force microscope (C-AFM) by sweeping a perpendicular external magnetic field ($H_{ext}$). FIG. 12A is a conceptual and schematic diagram illustrating the experimental setup, in which the AFM tip is grounded and the bias voltage ($V_{bias}$) is applied at the MgO substrate. FIG. 12B is a plot of minor magnetoresistance versus applied perpendicular external magnetic field ($H_{ext}$) for 100-nm diameter FePd SAF p-MTJs at different bias voltages ($V_{bias}$=+0.75 V, −0.1 V and −0.75 V, respectively). In the example of FIG. 12B, the positive bias voltage enhances the switching field ($H_{swf}$) and the negative bias voltage reduces the switching field ($H_{swf}$). This indicates that the applied electric field affects the magnetic anisotropy of the bottom dual SAF free layer. Due to the stray field (dipole coupling) from the top reference layer, the shift of the minor MR-H loop was observed.

To evaluate the switching field distribution (SFD), multiple magnetoresistance versus applied perpendicular external magnetic field ($H_{ext}$) loops were measured at a given $V_{bias}$. The mean coercivity ($H_c$) value was obtained by fitting SFD using the Kurkijarvi-Fulton-Dunkelberger equation:

$$\sigma = \left\{ \frac{1}{\tau_0 v} \exp\left[-K_{eff} V \left(1 - \frac{HM_s}{2K_{eff}}\right)^2\right] \right\} \times$$

$$\exp\left\{-\int_0^H \frac{1}{\tau_0 v} \exp\left[\frac{-K_{eff} V}{k_b T}\left(1 - \frac{hM_s}{2K_{eff}}\right)^2\right] dh\right\}$$

Where $\tau_0$ is the attempt time (equal to $10^{-9}$ s), v is the ramping rate of $H_{ext}$ (equal to about 350 Oe/s), $M_s$ is the saturation magnetization of the bottom dual SAF free layer (equal to about 970 emu/cm$^3$), kB is the Boltzmann constant, and T is the testing temperature (equal to 300 K). FIG. 12C is a plot depicting the mean coercivity ($H_c$) of the bottom dual SAF free layer as a function of the bias voltage ($V_{bias}$). The mean coercivity of the bottom dual SAF free layer shows a typically linear behavior, which presents the same trend with the theoretical calculation and experimental results. The mean coercivity value dramatically increases from about 145 Oe to about 900 Oe when the bias voltage ($V_{bias}$) increases from from $-0.75$ V to $+0.75$ V.

Figure 13:
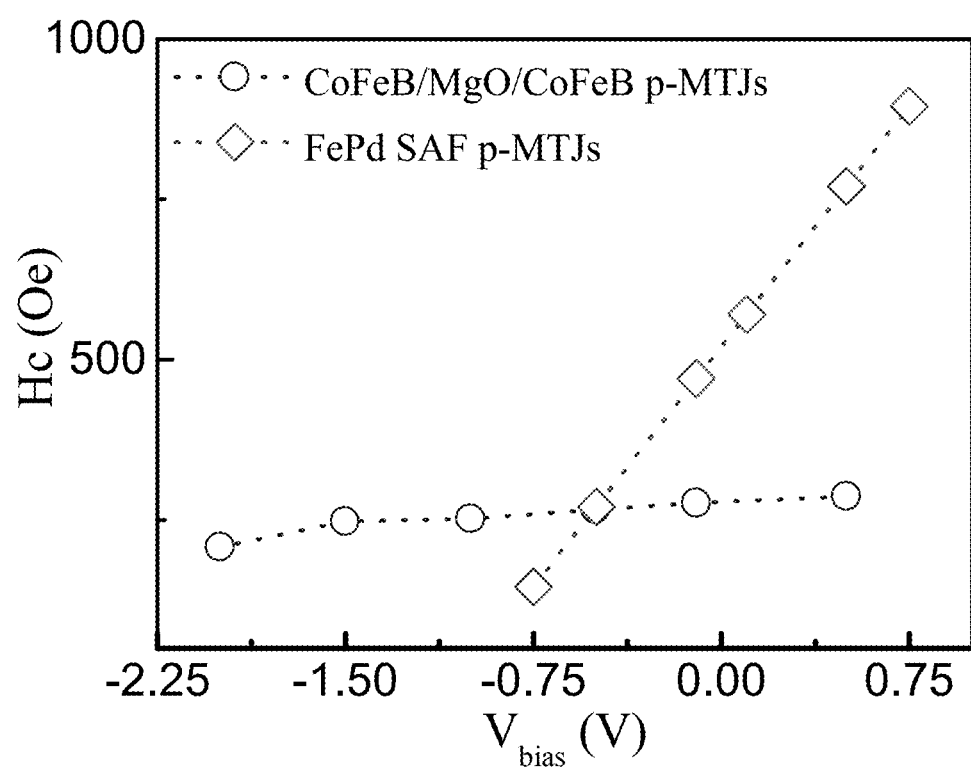
FIG. 13 is a plot depicting the mean coercivity ($H_c$) of a dual SAF free layer as a function of the bias voltage ($V_{bias}$) in comparison to mean coercivity ($H_c$) of a CoFeB free layer in the CoFeB/MgO/CoFeB perpendicular magnetic tunnel junction as a function of bias voltage.

This increasing mean coercivity value is more than one order magnitude larger than that of p-MTJs with a CoFeB single layer. FIG. 13 is a plot depicting the mean coercivity ($H_c$) of the bottom dual SAF free layer as a function of the bias voltage ($V_{bias}$) in comparison to mean coercivity ($H_c$) of a CoFeB/MgO/CoFeB p-MTJ as a function of bias voltage. For FePd SAF p-MTJs, the mean coercivity ($H_c$) shows a dramatic increase from 145 Oe to 900 Oe as the bias voltage increases from $-0.75$ volts to 0.75 volts. However, the mean coercivity ($H_c$) only increases from 205 Oe to 290 Oe for the CoFeB p-MTJs. The larger mean coercivity is believed to be due to the electric field from the bias voltage modifying the magnetic anisotropy of the ferromagnetic layer(s), further enhancing or reducing the strength of the coupling between ferromagnetic layers, which results in the significant change of the mean coercivity ($H_c$) value.

In this example, the positive bias voltage increases the i-PMA of the Ta/CoFeB/MgO stack in the FePD dual SAF p-MTJ, which enhances the AFM coupling between the CoFeB and FePd layers, showing the increasing of the $H_c$ of the bottom dual SAF free layer. In contrast, the negative bias voltage decreases the i-PMA of the CoFeB layer, which leads to ferromagnetic coupling between the CoFeB and FePd layers and decreases the $H_c$ of the bottom dual SAF free layer.

$K_{u,eff}$ was then calculated and $\xi$ evaluated for the bottom dual SAF free layer at the different bias voltages ($V_{bias}$) by fitting SFD using the equation presented above. FIG. 12D is a plot of $K_{u,eff}$ versus bias voltage. When the bias voltage ($V_{bias}$) changes from $-0.75$ V to $+0.75$ V, $K_{u,eff}$ linearly increases from 0.15 Merg/cm$^3$ to 0.53 Merg/cm$^3$. The $\xi$ value is calculated by following the equation of $$K_{eff}(V_{bias}) = K_{eff}(0) - \frac{\xi V_{bias}}{t_{MgO}^2},$$

where $K_{eff}(0)$ is about 0.395 Merg/cm$^3$ and is the magnetic anisotropy of the bottom dual SAF free layer with $V_{bias}=0$, and $t_{MgO}$ is the MgO thickness. By fitting the $K_{u,eff}$ curve, the $\xi$ of the bottom dual SAF free layer was evaluated to be about 117 fJ/(V*m).

The feasibility of electric field switching of the p-MTJ devices was then investigated. The current versus bias voltage ($V_{bias}$) curve of the sub-100 nm FePd SAF p-MTJ devices was measured at room temperature using the same C-AFM setup without applying the perpendicular external magnetic field ($H_{ext}$). The I-V curves were obtained by sweeping $V_{bias}$ from $-0.6$ V to $+0.6$ V for 100-nm diameter FePd SAF p-MTJ devices annealed at 350° C. FIG. 14A is a plot of the I-V curve. Sharp magnetization switching is clearly seen in the insets of FIG. 14A when a negative bias voltage of about $-0.46$ V (I=$-8.92$ μA) and a positive bias voltage of about $+0.48$ V (I=$+8.73$ μA) were applied, respectively. This indicates that the magnetization is switched from the parallel state to the antiparallel state and then switched back from the antiparallel state to the parallel state. The magnetoresistance ratios were calculated to be about 6.9% and about 3.7% and the switching current densities ($J_c$) were evaluated to be about $1.13 \times 10^5$ A/cm$^2$ and about $1.11 \times 10^5$ A/cm$^2$ for the parallel to antiparallel state change and antiparallel to parallel state change, respectively.

To further confirm the electric-field driven bi-directional magnetization switching in p-MTJs, the current vs. time curve was measured while applying a voltage pulse for 100-nm diameter FePd SAF p-MTJs, as presented in FIG. 14B. FIG. 14B illustrates plots of bias voltage versus time and current versus time for 100-nm diameter FePd SAF p-MTJs. During the measurement, negative and positive 0.85 V pulses were applied for writing, then a positive 0.1 V pulse was used to read the resistance. As shown in FIG. 14B, the p-MTJ has a low resistance value at the initial, parallel state. Writing with a positive +0.85 V voltage pulse induces the antiparallel state and a relatively higher resistance is obtained. Writing with a negative $-0.85$ V voltage pulse induces the parallel state exhibiting a relatively lower resistance. Because of the large RA and a low switching current density $\sim 1.1 \times 10^5$ A/cm$^2$, there should have been a very limited spin-transfer torque (STT) effect.

Figure 15:
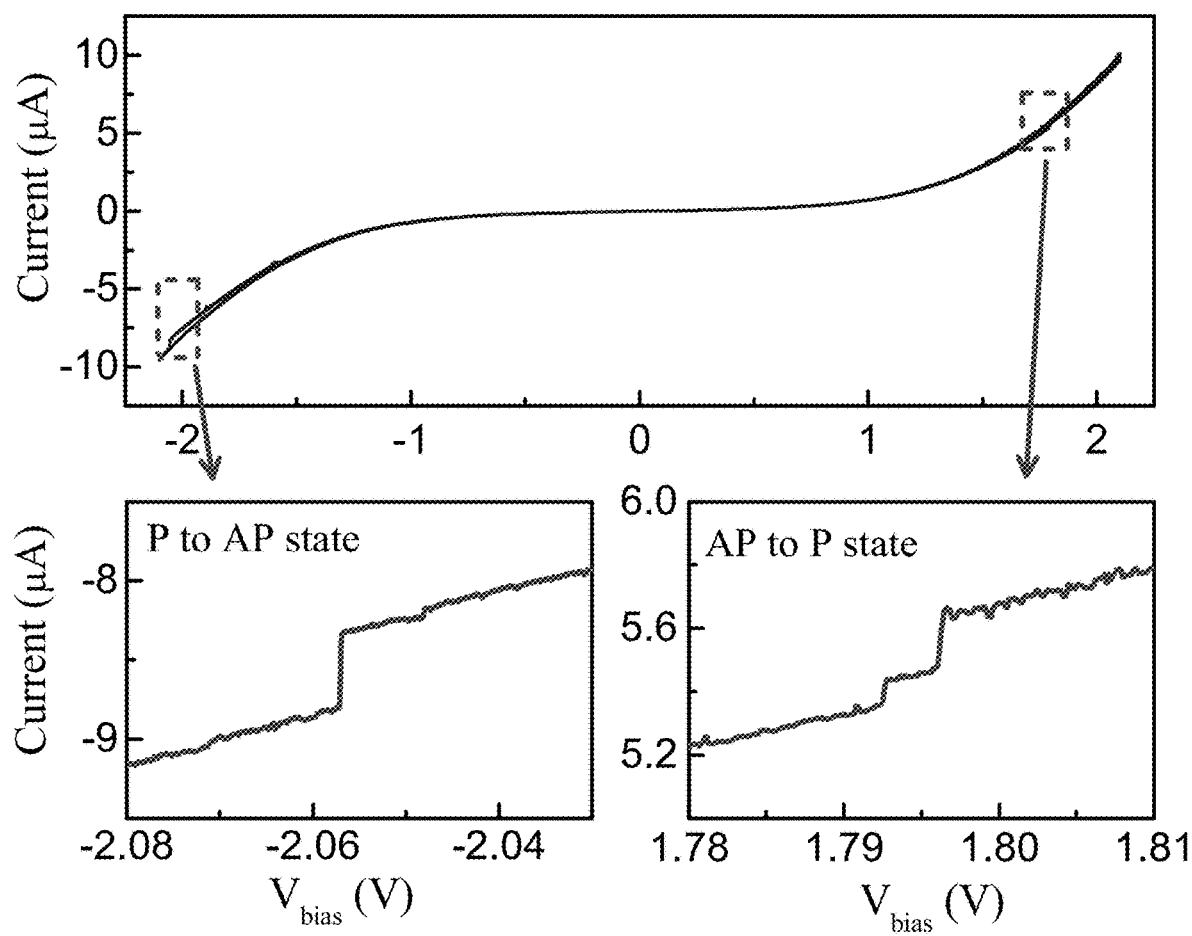
FIG. 15 is a plot of a current versus bias voltage ($V_{bias}$) curve (I-V curve) obtained by sweeping the bias voltage ($V_{bias}$) from −2.1 V to +2.1 V for a 35-nm diameter FePd synthetic antiferromagnet perpendicular magnetic tunnel junction annealed at 400° C.

The switching was also observed in 35-nm diameter FePd SAF p-MTJs annealed at 400° C., as shown in FIG. 15. FIG. 15 is a plot of a current versus bias voltage ($V_{bias}$) curve (I-V curve) obtained by sweeping the bias voltage ($V_{bias}$) from $-2.1$ V to $+2.1$ V for a 35-nm diameter FePd SAF p-MTJ devices annealed at 400° C. Annealing at 400° C. satisfies the requirement of the temperatures used for back-end-of-line processes for existing complementary metal-oxide-semiconductor (CMOS) technologies. The magnetization is switched from parallel to antiparallel and antiparallel to parallel states with a negative ($V_{bias}$) of about $-2.06$ V (I=8.8 μA) and a positive bias voltage ($V_{bias}$) of about +1.8 V (I=5.7 μA), respectively. The corresponding magnetoresistance ratios are about 5.5% for the antiparallel to parallel state change with $J_c$ equal to about $1.4 \times 10^5$ A/cm$^2$ and about 5.7% for the parallel to antiparallel state with $J_c$ equal to about $2.2 \times 10^5$ A/cm$^2$.

Figure 16:
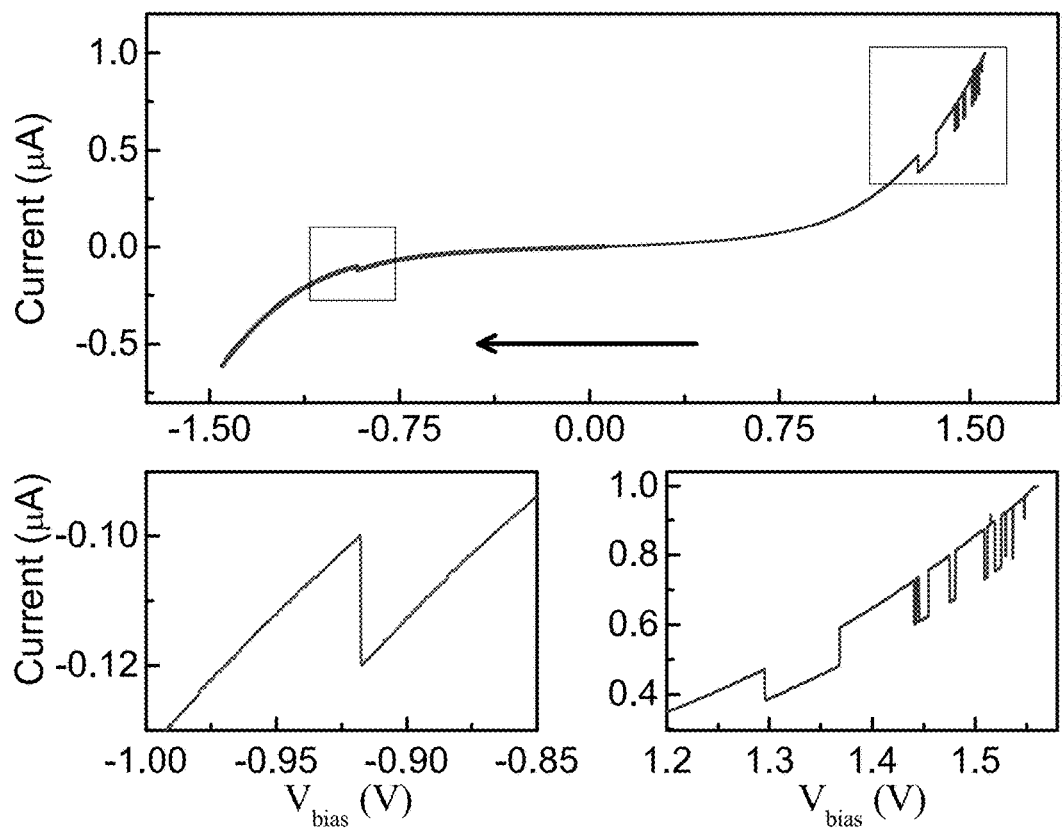
FIG. 16 is a plot of a current versus bias voltage ($V_{bias}$) curve (I-V curve) obtained by sweeping the bias voltage ($V_{bias}$) from −1.5 V to +1.7 V for a 40-nm diameter FePd synthetic antiferromagnet perpendicular magnetic tunnel junction annealed at 350° C.

A 40-nm diameter p-MTJ device annealed at 350° C. showed the unique property of the bias voltage-controlled random magnetization switching. FIG. 16 is a plot of a current versus bias voltage ($V_{bias}$) curve (I-V curve) obtained by sweeping the bias voltage ($V_{bias}$) from $-1.5$ V to $+1.7$ V for a 40-nm diameter FePd SAF p-MTJ devices annealed at 350° C. Telegraphic magnetization switching was observed when sweeping the bias voltage ($V_{bias}$) from +1.55 V to +1.28 V. As the bias voltage ($V_{bias}$) continues to decrease, the telegraphic switching disappears. A single parallel to antiparallel state magnetization switching was observed with the bias voltage ($V_{bias}$) equal to about −0.92 V. These characteristics of p-MTJs obtained could be used to realize stochastic computing devices and stochastic spiking neural networks.

Various examples have been described. These and other examples are within the scope of the following claims.

What is claimed is:

1. A magnetic device comprising:
a layer stack comprising:
a first ferromagnetic layer;
a non-magnetic spacer layer on the first ferromagnetic layer;
a second ferromagnetic layer on the non-magnetic spacer layer;
an oxide layer on the second ferromagnetic layer;
wherein the layer stack is configured so that a magnetic orientation of the second ferromagnetic layer is configured to be switched by a bias voltage across the layer stack without application of an external magnetic field or a current, wherein a thickness and composition of the non-magnetic spacer layer is selected to enable a switching direction of the magnetic orientation of the second ferromagnetic layer to be controlled by a sign of the bias voltage, and wherein the thickness of non-magnetic spacer layer is selected to cause antiferromagnetic coupling of the first ferromagnetic layer and the second ferromagnetic layer in the absence of the bias voltage.

2. The magnetic device of claim 1, wherein the non-magnetic spacer layer comprises at least one of Ru, Ir, Ta, Cr, W, Mo, Re, Hf, Zr, or V.

3. The magnetic device of claim 1, wherein:
the first ferromagnetic layer comprises at least one of a FePd alloy, a FePt alloy, a CoPd alloy, a CoPt alloy, a MnAl alloy, a MnBi alloy, a MnGaN alloy, a MnGeN alloy, or a Mn-based Heusler alloy; and
the second ferromagnetic layer comprises at least one of a CoFeB alloy, a CoFe alloy, a Co-based alloy, a Fe-based alloy, a Co-based Heusler alloy, or a Mn-based Heusler alloy.

4. The magnetic device of claim 1, wherein a sign of the bias voltage affects a sign or strength of the interlayer exchange coupling between the first ferromagnetic layer and the second ferromagnetic layer.

5. The magnetic device of claim 1, further comprising:
a second non-magnetic layer comprising at least one of Ru, Ir, Ta, Cr, W, Mo, Re, Hf, Zr or V; and
a third ferromagnetic layer, wherein:
the first ferromagnetic layer is on the second non-magnetic layer and the second non-magnetic layer is on the third ferromagnetic layer;
a thickness and a composition of the second non-magnetic layer are selected such that the third ferromagnetic layer and the second ferromagnetic layer are antiferromagnetically coupled; and
the thickness and the composition of the second non-magnetic layer and a thickness and a composition of the non-magnetic layer are selected so that interlayer exchange coupling between the second ferromagnetic layer and the third ferromagnetic layer is stronger than interlayer exchange coupling between the first ferromagnetic layer and the second ferromagnetic layer.

6. The magnetic device of claim 1, wherein the oxide layer is a tunnel barrier layer comprising MgO, further comprising a reference ferromagnetic layer on the tunnel barrier layer, wherein the magnetic device is a magnetic tunnel junction.

7. The magnetic device of claim 6, wherein the reference ferromagnetic layer comprises a synthetic antiferromagnet.

8. The magnetic device of claim 1, further comprising a write controller configured to control a voltage source to output a selected bias voltage.

9. The magnetic device of claim 8, wherein the write controller is configured to control the voltage source to output a bias voltage configured to enable stable bi-directional or random telegraphic switching of the magnetic orientation of the second ferromagnetic layer at room temperature.

10. A system comprising:
a plurality of magnetic devices, wherein at least one magnetic device of the plurality of magnetic devices comprises:
a layer stack comprising:
a first ferromagnetic layer;
a non-magnetic spacer layer on the first ferromagnetic layer;
a second ferromagnetic layer on the non-magnetic spacer layer;
an oxide layer on the second ferromagnetic layer;
wherein the layer stack is configured so that a magnetic orientation of the second ferromagnetic layer is configured to be switched by a bias voltage across the layer stack without application of an external magnetic field or a current, wherein a thickness and composition of the non-magnetic spacer layer is selected to enable a switching direction of the magnetic orientation of the second ferromagnetic layer to be controlled by a sign of the bias voltage, and wherein the thickness of non-magnetic spacer layer is selected to cause antiferromagnetic coupling of the first ferromagnetic layer and the second ferromagnetic layer in the absence of the bias voltage.

11. The system of claim 10, further comprising a voltage controlled magnetic anisotropy magnetoresistive random access memory device, wherein the voltage controlled magnetic anisotropy magnetoresistive random access memory device comprises the plurality of magnetic devices.

12. The system of claim 10, further comprising a stochastic computing device, wherein the stochastic computing device comprises a random bit stream generator, and wherein the random bit stream generator comprises the plurality of magnetic devices.

13. The system of claim 10, further comprising a stochastic spiking neural network device, wherein the stochastic spiking neural network device comprises the plurality of magnetic devices.

14. The system of claim 10, wherein each magnetic devices of the plurality of magnetic devices comprises a corresponding layer stack, and wherein each corresponding layer stack comprises:
a corresponding first ferromagnetic layer;
a corresponding non-magnetic spacer layer on the first corresponding ferromagnetic layer;
a corresponding second ferromagnetic layer on the corresponding non-magnetic spacer layer;
a corresponding oxide layer on the corresponding second ferromagnetic layer;
wherein the layer stack is configured so that a magnetic orientation of the corresponding second ferromagnetic layer is configured to be switched by a bias voltage across the layer stack without application of an external magnetic field or a current, wherein a thickness and composition of the corresponding non-magnetic spacer layer is selected to enable a switching direction of the magnetic orientation of the corresponding second ferromagnetic layer to be controlled by a sign of the bias voltage, and wherein the thickness of corresponding non-magnetic spacer layer is selected to cause antiferromagnetic coupling of the corresponding first ferromagnetic layer and the corresponding second ferromagnetic layer in the absence of the bias voltage.

15. The system of claim 10, wherein the non-magnetic spacer layer comprises at least one of Ru, Ir, Ta, Cr, W, Mo, Re, Hf, Zr, or V.

16. The system of claim 10, wherein:
the first ferromagnetic layer comprises at least one of a FePd alloy, a FePt alloy, a CoPd alloy, a CoPt alloy, a MnAl alloy, a MnBi alloy, a MnGaN alloy, a MnGeN alloy, or a Mn-based Heusler alloy; and
the second ferromagnetic layer comprises at least one of a CoFeB alloy, a CoFe alloy, a Co-based alloy, a Fe-based alloy, a Co-based Heusler alloy, or a Mn-based Heusler alloy.

17. The system of claim 10, wherein the layer stack further comprising:
a second non-magnetic layer comprising at least one of Ru, Ir, Ta, Cr, W, Mo, Re, Hf, Zr or V; and
a third ferromagnetic layer, wherein:
the first ferromagnetic layer is on the second non-magnetic layer and the second non-magnetic layer is on the third ferromagnetic layer;
a thickness and a composition of the second non-magnetic layer are selected such that the third ferromagnetic layer and the second ferromagnetic layer are antiferromagnetically coupled; and
the thickness and the composition of the second non-magnetic layer and a thickness and a composition of the non-magnetic layer are selected so that interlayer exchange coupling between the second ferromagnetic layer and the third ferromagnetic layer is stronger than interlayer exchange coupling between the first ferromagnetic layer and the second ferromagnetic layer.

18. The system of claim 10, further comprising a write controller configured to control a voltage source to output a selected bias voltage.

19. The system of claim 18, wherein the write controller is configured to control the voltage source to output a bias voltage configured to enable stable bi-directional or random telegraphic switching of the magnetic orientation of the second ferromagnetic layer at room temperature.

* * * * *